United States Patent
Algots et al.

(10) Patent No.: US 7,366,219 B2
(45) Date of Patent: Apr. 29, 2008

(54) LINE NARROWING MODULE

(75) Inventors: J. Martin Algots, San Diego, CA (US); Robert A. Bergstedt, Carlsbad, CA (US); Walter D. Gillespie, Poway, CA (US); Vladimir A. Kulgeyko, San Diego, CA (US); William N. Partlo, Poway, CA (US); German E. Rylov, Poway, CA (US); Richard L. Sandstrom, Encinitas, CA (US); Brian Strate, San Diego, CA (US); Timothy S. Dyer, Auburn, CA (US)

(73) Assignee: Cymer, Inc., San Diego, CA (US)

( * ) Notice: Subject to any disclaimer, the term of this patent is extended or adjusted under 35 U.S.C. 154(b) by 242 days.

(21) Appl. No.: 11/000,684

(22) Filed: Nov. 30, 2004

(65) Prior Publication Data

US 2006/0114957 A1 Jun. 1, 2006

(51) Int. Cl.
*H01S 3/22* (2006.01)
(52) U.S. Cl. .............................. 372/55; 372/57; 372/58
(58) Field of Classification Search .................. 372/55, 372/57, 102
See application file for complete search history.

(56) References Cited

U.S. PATENT DOCUMENTS 5,852,627 A * 12/1998 Ershov ........................ 372/108
6,856,638 B2 * 2/2005 Aab et al. ..................... 372/57

* cited by examiner

*Primary Examiner*—Michael Dung Nguyen
(74) *Attorney, Agent, or Firm*—William C. Cray

(57) ABSTRACT

A line narrowing method and module for a narrow band DUV high power high repetition rate gas discharge laser producing output laser light pulse beam pulses in bursts of pulses, the module having a nominal optical path are disclosed which may comprise: a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic; a first tuning mechanism operative in part to select the angle of incidence of the laser light pulse beam containing the respective pulse upon the dispersive center wavelength selection optic, by selecting an angle of transmission of the laser light pulse beam containing the pulse toward the dispersive center wavelength selection optic; a second tuning mechanism operative in part to select the angle of incidence of the laser light pulse beam containing the respective pulse by changing the position of the dispersive center wavelength selection optic relative to the nominal optical path of the line narrowing module; wherein the second tuning mechanism coarsely selects a value for the center wavelength and the first tuning mechanism more finely selects the value for the center wavelength. The apparatus and method may further comprise at least one beam expanding and redirecting prism in the optical path of the line narrowing module; the first tuning mechanism selecting an angle of incidence of the at least a first spatially defined portion of the laser light pulse beam by changing the position of the at least one beam expanding prism relative to the nominal optical path of the line narrowing module. The first and second tuning mechanisms may be controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst. The first tuning mechanism may comprise an electro-mechanical course positioning mechanism and a fine positioning mechanism comprising an actuatable material that changes position or shape when actuated.

112 Claims, 11 Drawing Sheets

OPTICAL DESIGN FOR COMPACT LNM
ROBERT BERGSTEDT 5/27/04

LINE NARROWING MODULE

FIELD OF THE INVENTION

The present invention relates to a line narrowing module for a DUV high power high pulse repetition rate gas discharge laser system producing an output laser light pulse beam of pulses in bursts of pulses for use as a light source for manufacturing equipment treating the surface of a workpiece, e.g., a wafer in a semiconductor integrated circuit lithography tool to expose photoresist on the wafer.

RELATED APPLICATIONS

This application is related to U.S. application Ser. No. 11/000571 filed on the same day as this application, entitled HIGH POWER HIGH PULSE REPETITION RATE GAS DISCHARGE LASER SYSTEM BANDWIDTH MANAGEMENT, Attorney Docket No. 2004-0081-01, assigned to the common assignee of the present application, the disclosure of which is hereby incorporated by reference. The present application is also related to U.S. Pat. No. 5,095,492 issued to Sandstrom on Mar. 10, 1992, entitled SPECTRAL NARROWING TECHNIQUE, and U.S. Pat. No. 5,852,627, issued to Ershov on Dec. 22, 1998, entitled, LASER WITH LINE NARROWING OUTPUT COUPLER, and U.S. Pat. No. 5,898,72, issued to Fomenkov, et al. on Apr. 27, 1999, entitled, Excimer laser with greater spectral bandwidth and beam stability. and U.S. Pat. No. 5,978,409, issued to Das, et al. on Nov. 2, 1999, entitled LINE NARROWING APPARATUS WITH HIGH TRANSPARENCY PRISM BEAM EXPANDER, and U.S. Pat. No. 6,028,879, issued to Ershov on Feb. 22, 2000, entitled, NARROW BAND LASER WITH ETALON BASED OUTPUT COUPLER, and U.S. Pat. No. 6,094,448, issued to Fomenkov, et al. on Jul. 25, 2000, entitled, GRATING ASSEMBLY WITH BI-DIRECTIONAL BANDWIDTH CONTROL, and U.S. Pat. No. 6,163,559 issued to Watson on Dec. 19, 2000, entitled, BEAM EXPANDER FOR ULTRAVIOLET LASERS, and U.S. Pat. No. 6,192,064, issued to Algots, et al. on Feb. 20, 2001, entitled, NARROW BAND LASER WITH FINE WAVELENGTH CONTROL, and U.S. Pat. No. 6,212,217, issued to Erie, et al. on Apr. 3, 2001, entitled, SMART LASER WITH AUTOMATED BEAM QUALITY CONTROL, and U.S. Pat. No. 6,493,374, issued to Fomenkov, et al. on Dec. 10, 2002, entitled SMART LASER WITH FAST DEFORMABLE GRATING, and U.S. Pat. No. 6,496,528 issued to Titus, et al. on Dec. 17, 2002, entitled, LINE NARROWING UNIT WITH FLEXURAL GRATING MOUNT, U.S. Pat. No. 6,529,531, issued to Everage, et al. on Mar. 4, 2003, entitled, FAST WAVELENGTH CORRECTION TECHNIQUE FOR A LASER, and U.S. Pat. No. 6,532,247, issued to Spangler, et al. on Mar. 11, 2003, entitled LASER WAVELENGTH CONTROL UNIT WITH PIEZOELECTRIC DRIVER, and U.S. Pat. No. RE38,054, issued to Hofmann, et al. on Apr. 1, 2003, entitled, RELIABLE, MODULAR, PRODUCTION QUALITY NARROW-BAND HIGH REP RATE F2 LASER, and U.S. Pat. No. 6,650,666, issued to Spangler, et al. on Nov. 18, 2003, entitled LASER WAVELENGTH CONTROL UNIT WITH PIEZOELECTRIC DRIVER, and U.S. Pat. No. 6,671,294, issued to Kroyan, et al. on Dec. 30, 2003, entitled, LASER SPECTRAL ENGINEERING FOR LITHOGRAPHIC PROCESS, and U.S. Pat. No. 6,721,340, issued to Fomenkov, et al. on Apr. 13, 2004, entitled BANDWIDTH CONTROL TECHNIQUE FOR A LASER, and U.S. Pat. No. 6,738,410, issued to Partlo, et al. on May 18, 2004, entitled, LINE NARROWED LASER WITH BIDIRECTION BEAM EXPANSION, each of which is assigned to the common assignee of the present application and the disclosures of each of which are hereby incorporated by reference. The present application is also related to U.S. patent application Ser. No. 10/036,925, filed on Dec. 21, 2001, and published on Nov. 14, 2002, entitled LASER SPECTRAL ENGINEERING FOR LITHOGRAPHIC PROCESS, Pub. No. 2002-0167975A1, and U.S. patent application Ser. No. 10/956,784, filed on Oct. 1, 2004, entitled RELAX GAS DISCHARGE LASER LITHOGRAPHY LIGHT SOURCE, attorney Docket No. 2004-0078-01, assigned to the common assignee of the present application and the disclosures of which are hereby incorporated by reference.

BACKGROUND OF THE INVENTION

It is known in the art to employ within a laser resonance cavity, e.g., defined as a laser chamber between a partially reflective output coupler and a fully reflective mirror forming the cavity, e.g., in a single chamber laser oscillator or an oscillator portion of a two chambered laser system having a oscillator portion feeding a seed beam into an amplifying portion, e.g., a power amplifier in a master oscillator power amplifier ("MOPA") configuration, a line narrowing module. The line narrowing module is positioned and adapted to select a desired center wavelength around a narrow band of wavelengths, with the bandwidth of the narrow band also being carefully selected ordinarily to be of as narrow a bandwidth as possible, e.g., for lithography uses where chromatic aberrations in the lenses of a scanning lithography photo-resist exposure apparatus can be critical, but also to, e.g., be within some range of bandwidths, i.e., neither to large not too small, also, e.g., for photolithography reasons, e.g., for optimizing and enabling modem optical proximity correction techniques commonly used in preparing masks (reticles). For such reasons control of bandwidth in more than just a "not-to-exceed" mode is required, i.e., control is required within a narrow range of "not-to-exceed" and "not-to-go-below" specified values of bandwidth, and including with these requirements stability pulse to pulse.

It is also well known that such line narrowing modules may employ a variety of center wavelength selection optical elements, usually of the dispersive variety, which can reflect back into the optical path of, e.g., the laser oscillating resonance chamber light of the selected center wavelength and of a narrowed bandwidth, depending on a number of physical parameters of the line narrowing module and optical parameters and performance capabilities of the wavelength selective optical element, e.g., a dispersive optical element used.

In one commonly used line narrowing module of the type just described a reflective grating, e.g., an eschelle grating having a selected blaze angle and mounted in a Littrow configuration in the line narrowing module may be tuned to reflect back into the optical path of the laser oscillating resonance cavity light of a particular center wavelength, in part determined by the angle of incidence of the light in a laser light pulse beam pulse in the line narrowing module upon the dispersive optical element, e.g., the grating. Applicants' assignee's above noted patents show examples of such line narrowing modules.

It is also known in the art, as also exemplified in the above noted patents of applicants' assignee that one manner of controlling the angle of incidence of the laser light pulse beam upon the grating may be to employ a maximally reflective mirror for the desired center wavelength, e.g., 193 nm (KrF excimer lasers) or 248 nm (ArF excimer lasers), so-called by applicants' assignee and $R_{MAX}$ to reflect the laser light pulse beam passing through the line narrowing module upon the dispersive optical surface, e.g., the face of the grating.

Similarly, also as exemplified by the above referenced applicants' assignee's patents, it is well known that the laser light pulse beam may be expanded in the line narrowing module before being incident on wither the $R_{MAX}$, or equivalent, and the grating, or equivalent, for several reasons. Beam expansion may be employed for reasons of protecting the optical elements, including down stream expansion optics, the $R_{MAX}$ and/or the grating from high levels of fluence energy, even more critical as wavelength decreases below about 300 nm, e.g., at 248 nm and more critically at 193 nm, and more so still at 157 nm (molecular fluorine excimer lasers). Beam Expansion may also be employed to magnify the beam and thereby reduce the impact of beam dispersion characteristic in, e.g., fluorine gas discharge excimer/molecular fluorine lasers and improve the center wavelength selection of the grating and thus also the narrowing of the bandwidth, so-called line narrowing the laser output.

It is also well known in the art that, e.g., it may be desirable to rapidly control the selection of the angle of incidence of the laser light pulse beam on the grating, e.g., to control center wavelength based on feedback control on a pulse-to-pulse basis and/or to engineer an integrated spectrum comprising the net effect of the wavelength spectra for pulses in the output laser light pulse beam output by the laser system for purposes of controlling such things as a broadened depth of focus in, e.g., a lithography scanning apparatus. Existing angle of incidence selection mechanisms for such tuning, e.g., the $R_{MAX}$ and equivalents have some limits in this area, e.g., due to mechanical resonances and the bulk of the $R_{MAX}$ required to be moved at very rapid periodic rates, e.g., 2-4 kHz and above, and the limitations of moving such optical elements with different (though related) rotating mechanisms for both coarse and fine adjustment of the angle of incidence during operation of the line narrowing module.

U.S. Pat. No. 6,760,358, issued to Zimmerman, et al. on Jul. 6, 2004, entitled LINE-NARROWING OPTICS MODULE HAVING IMPROVED MECHANICAL PERFORMANCE, the disclosure of which is hereby incorporated by reference, discloses:

An apparatus for adjusting an orientation of an optical component mounted within a laser resonator with suppressed hysteresis includes an electro-mechanical device, a drive element, and a mechano-optical device coupled to the mounted optical component. The drive element is configured to contact and apply a force to the mechano-optical device in such a way as to adjust the orientation of the mechano-optical device, and thereby that of the optical component, to a known orientation within the laser resonator. The optical component is mounted such that stresses applied by the mount to the optical component are homogeneous and substantially thermally-independent.

It is known to move the dispersive optical element, e.g., a grating or an etalon for center wavelength control, as evidenced by U.S. Pat. Nos. or to move a beam expansion optical element with a fixed grating, in lieu of, e.g., using a rotatably positionable mirror, such as the $R_{MAX}$ or equivalents.

A need in the art exists, however, for a more effective line narrowing module which can, e.g., maintain or improve the center wavelength selection and control, e.g., wavelength stability pulse-to-pulse, using, e.g., a grating center wavelength selection element and means, including or in lieu of the $R_{MAX}$ for relatively simultaneous coarse and fine control of the angle of incidence of the laser light pulse beam pulses on the dispersive optical element, e.g., the grating. Applicants, according to aspects of embodiments of the present invention, have provided such improvements and modifications.

Diffraction grating have been known to fail, e.g., in ArF excimer laser LNM's. Applicants suspect that this failure is due at least in part to photo ionization of the aluminum underlayer on the grating, and subsequent oxidation reaction with $O_2$. It is also clear that oxygen diffuses through defects and potentially the bulk MgF2 coating on the grating face, which may in some cases be alleviated with a coating(s) on the grating face. In investigating how to extend, e.g., ArF grating lifetimes, applicants have noted that, in general, grating lifetime is strongly influenced by oxygen levels in the LNM. The lower the oxygen content in ppm, the better. In addition, the ArF grating failure mode appears faster than the KrF grating failure mode, which applicants suspect is due to the fact that at around 193 nm an ArF photon is able to ionize the imbedded Al layer, thereby actually activating it for oxygen attack. While applicants are not sure of this fact, it appears that at around the 248 nm KrF photon is not energetic enough to activate the Al and help it corrode in the presence of oxygen. Grating degradation is still oxygen content related, but in the case of KrF photons appears to be limited to oxygen transport through the $MgF_2$ layer (or reaction with imbedded oxygen).

Applicants propose a solution to grating lifetime degradation due to oxygen content in the LNM and also more specifically to accelerated degradation under the influence of higher energy photons.

SUMMARY OF THE INVENTION

A line narrowing method and module for a narrow band DUV high power high repetition rate gas discharge laser producing output laser light pulse beam pulses in bursts of pulses, the module having a nominal optical path are disclosed which may comprise: a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic; a first tuning mechanism operative in part to select the angle of incidence of the laser light pulse beam containing the respective pulse upon the dispersive center wavelength selection optic, by selecting an angle of transmission of the laser light pulse beam containing the pulse toward the dispersive center wavelength selection optic; a second tuning mechanism operative in part to select the angle of incidence of the laser light pulse beam containing the respective pulse by changing the position of the dispersive center wavelength selection optic relative to the nominal optical path of the line narrowing module; wherein the second tuning mechanism coarsely selects a value for the center wavelength and the first tuning mechanism more finely selects the value for the center wavelength. The apparatus and method may further comprise at least one beam expanding and redirecting prism in the optical path of the line narrowing module; the first tuning mechanism selecting an angle of incidence of the at least a first spatially defined portion of the laser light pulse beam by changing the position of the at least one beam expanding prism relative to the nominal optical path of the line narrowing module. The first and second tuning mechanisms may be controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst. The first tuning mechanism may comprise an electro-mechanical course positioning mechanism and a fine positioning mechanism comprising an actuatable material that changes position or shape when actuated. The actuatable material may be selected from a group consisting of electro-actuatable, magneto-actuatable and acousto-actuatable materials, and may comprise a piezoelectric material. The line narrowing module for a narrow band DUV high power high repetition rate gas discharge laser producing output laser light pulse beam pulses in bursts of pulses, the module having a nominal optical path may comprise: a dispersive center wavelength selection optic fixedly mounted along an optical path of the line narrowing module, selecting at least one center wavelength for each pulse determined at least in part by the angle of incidence of the laser light pulse beam containing the respective pulse on a dispersive wavelength selection optic; a first tuning mechanism operative in part to select an angle of incidence of the laser light pulse beam containing the respective pulse upon the dispersive center wavelength selection optic, by selecting an angle of transmission of the laser light pulse beam containing the pulse toward the dispersive center wavelength selection optic; a second tuning mechanism operative in part to select at least one angle of incidence of the laser light pulse beam containing the respective pulse by changing the angle of transmission of at least a spatially defined portion of the laser light pulse beam containing the pulse toward the first tuning mechanism; wherein the first tuning mechanism coarsely selects a value for the center wavelength and the second tuning mechanism more finely selects the value for the center wavelength. The first and second tuning mechanisms may comprise independently selectively refracting optical elements; the first and second tuning mechanisms selecting an angle of incidence of the laser light pulse beam on the dispersive optical element by changing the respective position of the first beam expanding mechanism and the second beam expanding mechanism relative to the nominal optical path of the line narrowing module. The first and second tuning mechanisms may be controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst. The first and second tuning mechanisms may each comprise an electro-mechanical course positioning mechanism and a fine positioning mechanism comprising an actuatable material that changes position or shape when actuated and may be selected from a group consisting of electro-actuatable, magneto-actuatable and acousto-actuatable materials and specifically may be a piezoelectric material. The first and second tuning mechanisms each comprise a beam expanding prism. The first tuning mechanism may comprise a first angle of transmission selection mechanism comprises of an electro-mechanical positioning mechanism without a fine tuning positioning mechanism; and the second tuning mechanism may comprise a second angle of transmission selection mechanism comprises an actuated material positioning mechanism without a course tuning positioning mechanism. The actuatable material positioning mechanism may comprise an actuatable material that changes position or shape when actuated, which may be selected from a group consisting of electro-actuatable, magneto-actuatable and acousto-actuatable materials and may be a piezoelectric material. The line narrowing module for a narrow band DUV high power high repetition rate gas discharge laser producing output laser light pulse beam pulses in bursts of pulses, the module having a nominal optical path may comprise: a dispersive center wavelength selection optic mounted within an optical path of the line narrowing module, selecting at least one center wavelength for each pulse determined at least in part by the angle of incidence of the laser light pulse beam containing the respective pulse on a dispersive optical face of the dispersive wavelength selection optic; a fast tuning mechanism operative to select an angle of incidence of the laser light pulse beam containing the respective pulse upon the dispersive center wavelength selection optic, by selecting an angle of transmission of the laser light pulse beam containing the pulse toward the dispersive center wavelength selection optic; the fast tuning mechanism comprising a single both transmissive and reflective optical element. The transmissive and reflective optic may comprise a beam expanding prism with at least one face coated with a totally reflective coating reflecting the beam back into the prism to another face where total internal reflection occurs reflecting the beam to a surface of exit from the prism. The fast tuning mechanism may be controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst. The fast tuning mechanism may comprise an electro-mechanical course positioning mechanism and a fine positioning mechanism comprising an actuatable material that changes position or shape when actuated, which may be selected from a group consisting of electro-actuatable devices, magneto-actuated devices and acousto-actuatable devices and may comprise a piezoelectric material. The line narrowing module for a narrow band DUV high power high repetition rate gas discharge laser producing output laser light pulse beam pulses in bursts of pulses, the module having a nominal optical path may comprise: a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic along a first elongated longitudinally extending dispersive surface of the dispersive center wavelength selection optic, extending in a first direction; a translation mechanism translating the grating in a second direction generally orthogonal to the first direction sufficiently to expose a second unused elongated longitudinally extending dispersive surface of the dispersive center wavelength selection optic to the laser light pulse beam. The dispersive center wavelength selection optic may comprise a grating, e.g., an eschelle grating. The translation mechanism translates the dispersive center wavelength selection optic to expose the second unused elongated longitudinally extending dispersive surface of the dispersive center wavelength selection optic at the end of life of the first elongated longitudinally extending dispersive surface of the dispersive center wavelength selection optic. The line narrowing module for a narrow band DUV high power high repetition rate gas discharge laser producing output laser light pulse beam pulses in bursts of pulses, the module having a nominal optical path may comprise: a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic; a first tuning mechanism operative in part to select an angle of incidence of at least a first spatially defined portion of the laser light pulse beam containing the respective pulse upon the dispersive center wavelength selection optic, by selecting an angle of transmission of the at least a first spatially defined portion of the laser light pulse beam containing the pulse toward a second tuning mechanism; the second tuning mechanism being operative in part to select the angle of incidence of the at least a first spatially defined portion of the laser light pulse beam containing the respective pulse by changing an angle of reflection of the at least a first spatially defined portion of the laser light pulse onto the dispersive center wavelength selection optic; wherein the first tuning mechanism coarsely selects a value for the center wavelength and the second tuning mechanism more finely selects the value for the center wavelength. The first and second tuning mechanisms may be controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst. The first and second tuning mechanisms each may comprise an electro-mechanical course positioning mechanism and a fine positioning mechanism comprising an actuatable material that changes position or shape when actuated, elected from a group consisting of electro-actuatable, magneto-actuatable and acousto-actuatable materials, e.g., a piezoelectric material. The first tuning mechanism may comprise a beam expanding prism. The second tuning mechanism may comprise a fast tuning mirror. The line narrowing module for a narrow band DUV high power high repetition rate gas discharge laser producing output laser light pulse beam pulses in bursts of pulses, the module having a nominal optical path may comprise: a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic; a first tuning mechanism operative in part to select a first angle of incidence of a first spatially defined portion of the laser light pulse beam containing the respective pulse upon the dispersive center wavelength selection optic, and a second tuning mechanism operative to select a second angle of incidence of a second spatially defined portion of the laser light pulse, respectively by selecting a first and a second angle of transmission of the respective spatially defined portions of the laser light pulse beam containing the pulse relative to a nominal optical path through the line narrowing module toward the dispersive center wavelength selection optic; the tuning mechanism selecting the center wavelength for each of the first and second spatially defined portions of the pulse in the laser light pulse beam to have overlapping spectra, forming a combined spectrum, the degree of overlapping selected to achieve a desired ratio between a first measure of the bandwidth of the combined spectrum and a second measure of the bandwidth of the combined spectrum. The first tuning mechanism may comprise a variably refractive optical element inserted into the nominal optical path by a selected amount defining the first angle of incidence for the first spatially defined portion of the laser light pulse beam and the second tuning mechanism selecting the second angle of incidence by not modifying the angle of transmission of the second spatially defined portion of the laser light pulse beam pulse. The first tuning mechanism may comprise an optical element having a surface of incidence or transmission defining a plurality of refractive transmission angles relative to the nominal optical path for a laser light pulse beam incident on the optical element at one of a plurality of selected positions along a longitudinal axis of the optical element parallel to a direction of insertion of the optical element into the nominal optical path. The first and second tuning mechanisms may each comprise an optical element having a surface of incidence or transmission defining a plurality of refractive transmission angles relative to the nominal optical path for a laser light pulse beam incident on the optical element at one of a plurality of selected positions along a longitudinal axis of the optical element parallel to a direction of insertion of the optical element into the nominal optical path. The first tuning mechanism may comprise the surface of incidence or transmission which may comprise a plurality of adjacent wedges each defining a respective refractive angle of transmission of the laser light pulse beam through a respective one of the plurality of adjacent wedges. The curved surface may comprise a cylindrical surface. A method of removing undesirable material contained in gaseous form or compounds of which are contained in gaseous form in a fluorine gas DUV laser apparatus optical path is disclosed which may comprise the steps of: including a material exposed to stray DUV light in the optical path of the laser which is subject to ionization under the influence of either DUV light or heat or both and which is capable of gettering the undesired material from the gaseous form of the material or its compound.

DETAILED DESCRIPTION OF PREFERRED EMBODIMENTS

Figure 1:
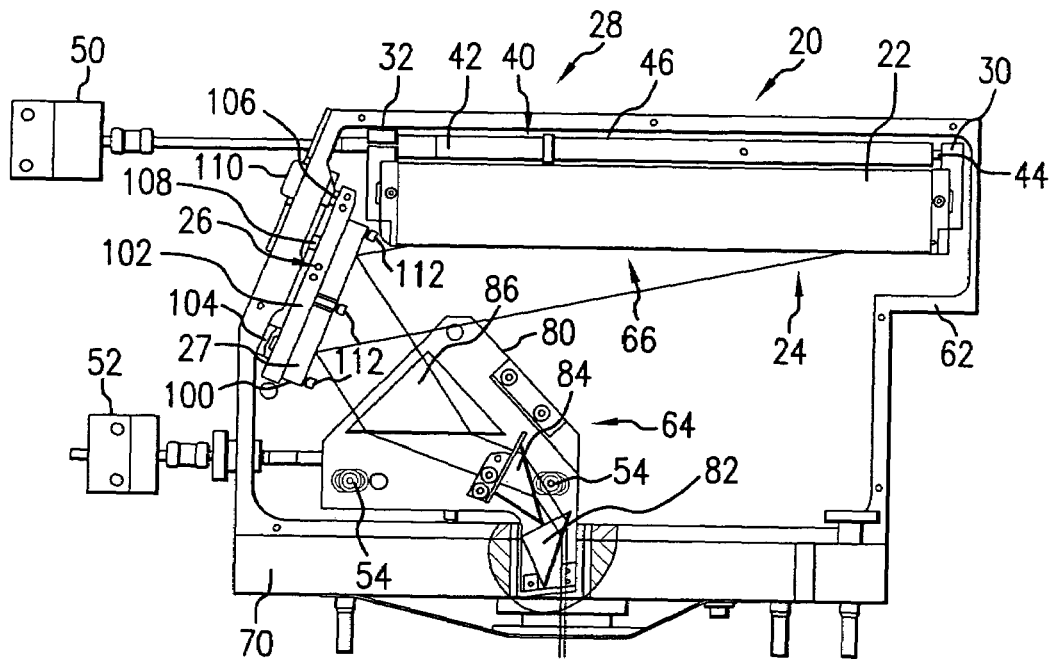
FIG. 1 shows a top plan view of a prior art line narrowing module.

Turning now to FIG. 1 there is shown a top plan view of a prior art line narrowing module 28. according to aspects of the operation of the prior art line narrowing module of FIG. 1 the positioning of a dispersive center wavelength selection optical element, e.g., a grating 22 and its construction, e.g., its blaze angle, length, groove pitch, and angle of incidence of the laser light pulse beam on the grating (defining, e.g., a nominal optical path to and from the grating 22 within the optical path through the line narrowing module 28—into and out of the line narrowing module 28) etc., define an order of dispersion that will be reflected back along the nominal optical path at what angle and at what wavelength, e.g., 79° at 193.3 nm desired center wavelength. The grating 22 and its construction in and of themselves can be tuned, e.g., using the blaze angle, to maximize the efficiency of the line narrowing module 28, e.g., by selecting an order that contains the largest portion of the intensity of the light at the given nominal wavelength, e.g., 193.4 nm, thus limiting the optical losses in selecting the desired center wavelength and to a degree within some limited range of selected center wavelengths about this nominal desired selected center wavelength.

Within that order the grating reflects back along the optical path of the line narrowing module 28 a rainbow of light that is at wavelengths on either side of the nominal desired selected center wavelength, depending on, among other things, the angle of incidence upon the grating 22. The angle of incidence upon the grating 22 can be defined in turn by using a stationary grating 22 and a tuning mechanism 26 that reflects or refracts light onto the grating 22 at a selected angle of incidence, e.g., from within a relatively broad band of wavelengths, e.g., around 300 nm around some center wavelength, e.g., about 193.3 nm for an ArF excimer output laser light pulse beam. According to aspects of an embodiment of the present invention, this may also be done by, e.g., moving both the grating 22 and the tuning mechanism 26 to collectively define a final angle of incidence on the grating 22 (and, e.g., the corresponding angle of reflectance back from the grating 22) along the optical path of the line narrowing module 28.

In addition to the fine and coarse tuning of the center wavelength noted above, according to aspects of an embodiment of the present invention, the coarse tuning may be done by changing the position of one of a plurality of optical elements within the optical path of the line narrowing module 28 having a first relatively large impact on the final angle of incidence on a stationary grating 22 and also changing the position of a second one of a plurality of optical elements within the optical path of the line narrowing module 28 having a second relatively smaller impact on the final angle of incidence on the stationary grating 22. In this fashion, the one of the plurality of optical elements may be used for coarse center wavelength selection mechanism and the second of the optical elements may be used essentially simultaneously as the fine tuning for the finally selected center wavelength.

In other words, the first optical element may select the final angle of incidence on the grating within a band of, e.g., several nm and the other of the optical elements can serve to more finely tune around the selected center wavelength of that band, e.g., on the order of several pm. The first optic may be a beam expanding prism, e.g., within a plurality of beam expanding prisms that has a relatively high magnification, e.g., the next to last or last prisms (86, 84) in, e.g., a three or four prism beam expander prism assembly 64, as shown in FIG. 1, and the second optical element bay be, e.g., the first or second beam expanding prism (82, 84) in, e.g., a three or four prism beam expander prism assembly 64, as shown in FIG. 1. It will also be understood that the beam expander prism assembly 64 may be as illustrated partly schematically in the view of FIG. 2 to include more than three prisms, e.g., four prisms, with the first two being prisms 82, 84 respectively and the last two being 86, 88, respectively.

According to aspects of an embodiment of the present invention, using one of the beam expanding prisms (82-88) to function as the turning mirror 102 of the tuning mechanism 26, as shown in FIG. 1, also can have several beneficial effects on the line narrowing module 28 and overall laser system functionality. According to one aspect of an embodiment of the present invention, this elimination of the so called $R_{MAX}$ tuning mirror 27 as is currently in use in applicants' assignee's laser systems, e.g., 7XXX and XLA-XXX single chamber and dual chambered laser systems, can create a more compact line narrowing module 28, also with a number of advantages both in performance and ability to, e.g., utilize a larger grating 22 within a LNM housing 62 (FIG. 2) that is not very significantly larger than existing LNM housing 62 (FIG. 1) and has a much smaller footprint than with an $R_{MAX}$ assembly 26 also included (unless it is chosen to employ an elongated grating assembly 66, as in FIG. 2. The housing 62 can be smaller, at least on one dimension, for either the case of using the larger grating 66 or the shorter one 22, thus, e.g., saving weight. In the configuration of, e.g., FIG. 2, according to aspects of an embodiment of the present invention in which the RMax assembly 26 is eliminated, there is also realized a reduction in the optical losses and wavefront aberrations associated with the use of an $R_{MAX}$ 27, e.g., from wavefront distortions on the $R_{MAX}$ mirror 27 itself and the added beam divergence and reduced output power associated with the increase in cavity length incurred in using the $R_{MAX}$ 27 to tune center wavelength by selecting the angle of incidence upon the dispersive wavelength selection optic, e.g., the eschelle grating 22. According to aspects of an embodiment of the present invention improvements in the efficiency and bandwidth control of the line narrowing module 28 are realized. According to aspects of an embodiment of the present invention wherein a larger grating 22 is used, with or without an $R_{MAX}$ tuning mirror 27 improvements in efficiency and bandwidth control are still achieved.

Existing $R_{MAX}$ tuning mechanisms 26 can be moved or dithered to change the angle of incidence of the laser light pulse beam pulses onto the wavelength selection element, e.g., the eschelle grating 22, on a pulse-to-pulse basis. Such dithering, with existing LNM tuning mechanism mirror assemblies 26 is accomplished in a coarse fashion by an electro-mechanical system, e.g., a stepper motor (not shown), which may operate to achieve wavelength selection tuning, e.g., by moving the tuning mirror 27 and/or an assembly 26 of which the tuning mirror is a part, e.g., through a lever arm that accentuates the size of the steps taken by the stepper motor (not shown), for coarse adjustment of the incidence angle and a more rapid and finely tuned adjustment of the incidence angle may be accomplished as in existing $R_{MAX}$ tuning mechanism 27 in applicants' assignee's laser systems, with an actuatable material that changes, e.g., shape or size when stimulated, e.g., with an electric field, acoustic energy or a magnetic field, e.g., one or more piezoelectric transducers.

However, existing $R_{MAX}$ tuning mechanisms 27 have certain shortcomings. Placed between the beam expanding prism assembly 64 and the grating 22, such $R_{MAX}$ mirrors 27 and associated assemblies 26, are relatively large in size, due to the magnification of the beam for divergence reduction purposes and also for purposes of utilizing as long a length of the grating 22 in the longitudinal axis of the grating 22 as is possible for better efficiency of bandwidth selection by the grating 22. At the ever increasing pulse repetition rates of the systems in question, e.g., 4 kHz and above currently and 6 kHz and above in the near future, the large physical mass of the $R_{MAX}$ 27 and its associated mounting and rotating assembly 26, being dithered by the electro-mechanical stepper motor/piezoelectric element(s), can have certain mechanical resonance effects limiting the pulse repetition rate of the laser system at which pulse-to-pulse dithering is possible or at least certain bands of frequencies where operation is distorted or otherwise impacted, so that effectively the operation is limited to some maximum laser output light pulse beam pulse repetition rate.

Figure 2:
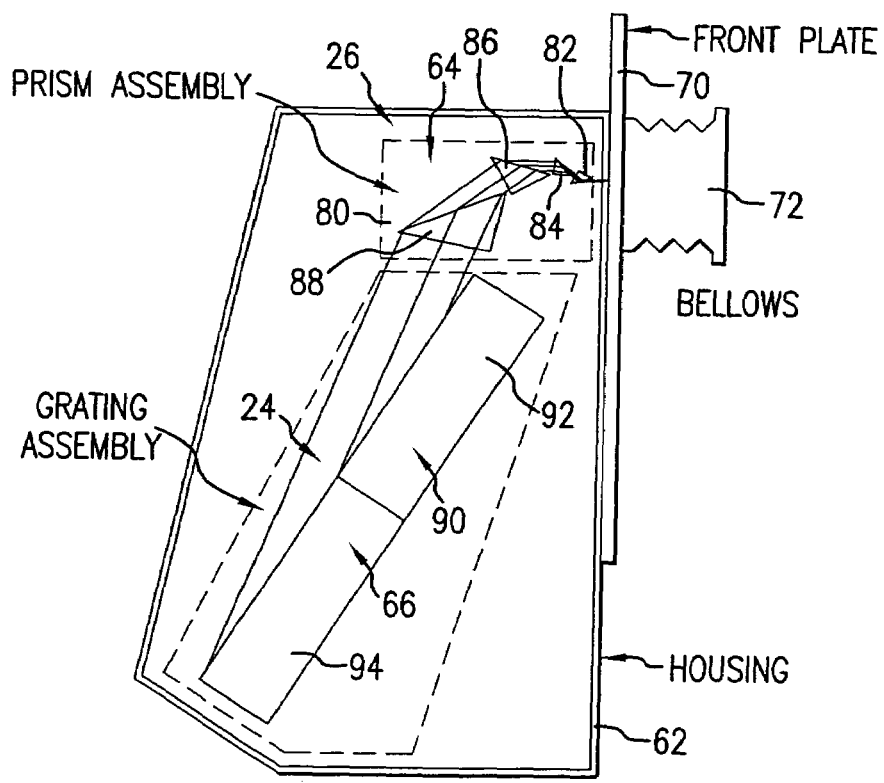
FIG. 2 shows a partially schematic top plan view of a line narrowing module according to aspects of an embodiment of the present invention.

The current optical configuration of the LNM contains a three prism beam expander 64, e.g., as shown in FIG. 1 or a four-prism beam expander 64, e.g., as shown in FIG. 2, a mirror ($R_{MAX}$ 27) and a grating 22. According to aspects of an embodiment of the present invention applicants have added a high reflectance coating to a surface 122 of one of the prisms 120.

Figure 3:
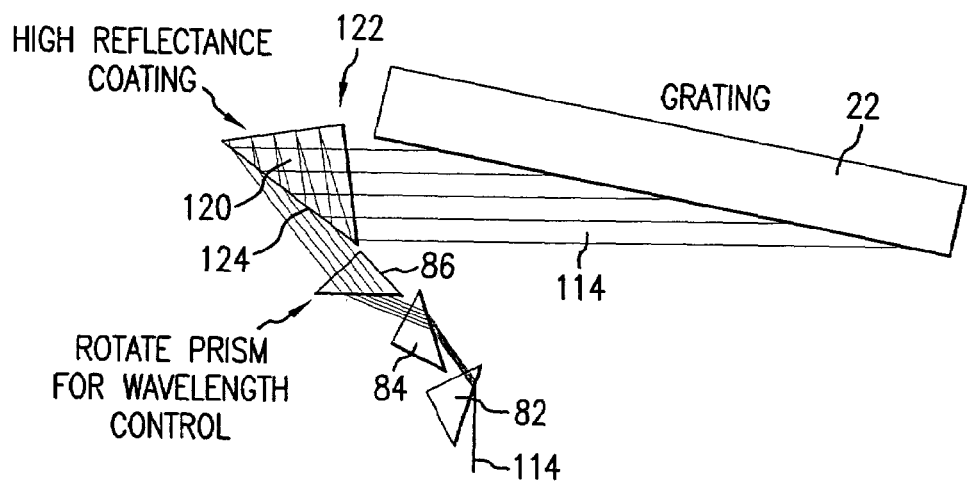
FIG. 3 shows a schematic top plan view of a line narrowing module according to aspects of an embodiment of the present invention.

As shown in FIG. 3, the light entering the prism 120 is reflected back into the prism 120 where it is totally internally reflected by the hypotenuse face 124 of the prism 120. The light then exits through the other side surface of the prism 120. The net effect is to rotate the laser light pulse beam 114 from the prism assembly 64 by 90°, eliminating the need for a mirror 27 to fold the beam 114. One or more of the remaining prisms, e.g., 82-86 as shown in FIG. 3 may be adjusted to control desired center wavelength.

Figure 4:
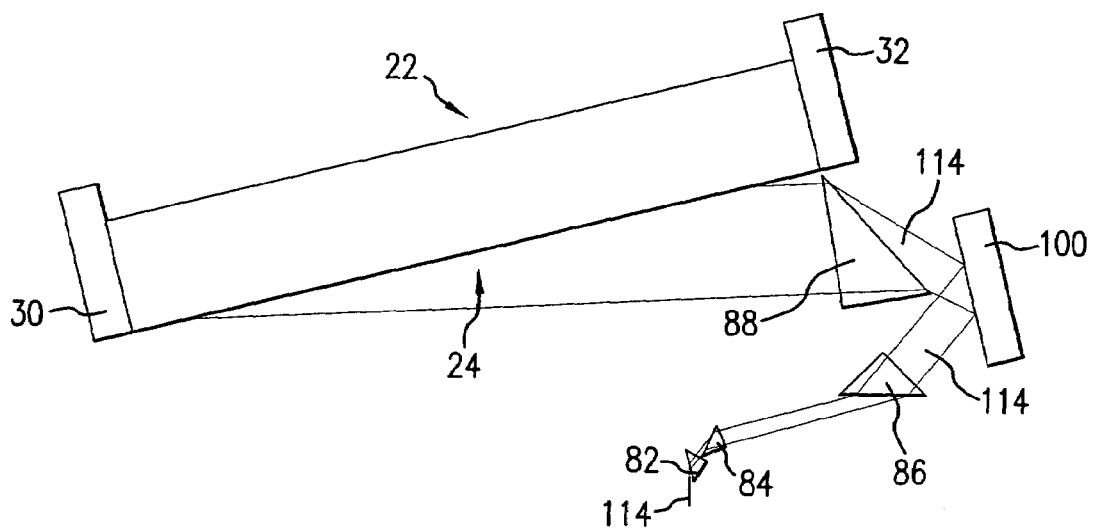
FIG. 4 shows a schematic top plan view of a line narrowing module according to aspects of an embodiment of the present invention.
Figure 5:
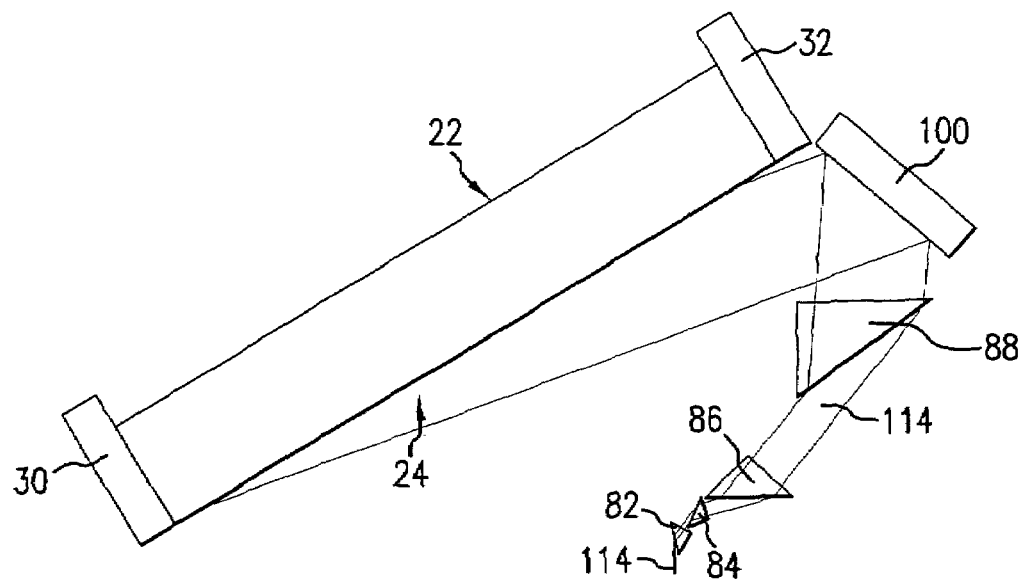
FIG. 5 shows a schematic top plan view of a line narrowing module according to aspect of an embodiment of the present invention.

Turning now to FIGS. 4 and 5 there are shown top plan views of simultaneous coarse and fine adjustment of selected desired center wavelength according to aspects of embodiments of line narrowing modules 28 according to aspects of embodiments of the present invention in which a tuning mirror, e.g., an $R_{MAX}$ may be retained, but only, e.g., perform a coarse or a fine adjustment of angle of incidence on, e.g., a grating 22, but not both. As shown in FIG. 4, the line narrowing module 28 may include a prism beam expanding assembly 64, e.g., including prisms 82-86, with the laser light pulse beam 114 passing through prisms 82-86 and being directed onto the $R_{MAX}$ 100 by prism 86 and then passing through prism 88 and being directed from there to the grating 22 dispersive surface 24. according to aspects of an embodiment of the present invention, the $R_{MAX}$ 100 may be used only for coarse angle of incidence selection and one or more of the prisms 82-88 may be rotated more rapidly, e.g., about a rotational axis perpendicular to the plane of paper in the view illustrated in FIG. 4 for fine angle of incidence selection. Such a prism, having much less mass than existing $R_{MAX}$ tuning mirror 27 rotating assemblies 26 prospectively have, applicants believe, much less susceptibility to the, e.g., mechanical resonance problems and also to time to settle to the desired position from a prior position, thus significantly improving, e.g., current pulse-to-pulse angle of incidence selection capabilities at pulse repetition rates above about 2 kHz. In addition, the smallest, and thus most easily rotated, prism 82 may be used to most rapidly change the resultant finely tuned angle of incidence on the grating 22 just as prism 88 could be so employed. Further, in addition to the $R_{MAX}$ use for coarse adjustment of the angle of incidence, more than one prism 82-88 in the prism assembly 64 may be used for various levels of fine tuning of the angle of incidence on the grating to overcome issues engendered, e.g., by increasing repetition rate and/or mechanical resonances or the like.

To similar effect could be the embodiment, aspects of which are shown in FIG. 5, wherein the beam 114 passes through the four prism assembly 64 prisms 82-88 and is then incident on the $R_{MAX}$ 100 and from there reflected onto the grating 22 dispersive optical surface 24. Similar arrangements for coarse and fine and multiple fine angle of incidence adjustment may be divided between the $R_{MAX}$ and prism assembly 64 as discussed in regard to FIG. 4.

Applicants propose employing the unused, and undamaged remaining lateral real estate on the grating at end of life for a previously used portion, by translating the grating in the vertical direction within the LNM module housing, i.e., orthogonally to the longitudinal axis of the grating to expose an unused portion of the grating to the laser beam being line narrowed.

This may be done, e.g., by a mechanical micrometer or other manually operated translation mechanism adapted to shift the grating in the lateral direction (horizontally as shown in the figure) sufficiently to remove the optically damaged real estate of the grating and place the incident laser beam being ling narrowed in a second undamaged strip of the grating surface. According to current dimensions mentioned above, this may actually be done twice during the life of a single grating.

The lateral translation of the position of the grating may also be done for purposes of fine tuning the response of the grating in the line narrowing process in producing the desired narrow bandwidth to meet specifications. This can account for any manufacturing defects in, e.g., some or all of the groves in a first region being used on the grating surface real estate as opposed to a second more finely tuned, and presumably less distorted portion of the grating surface real estate, the selection of which can experimentally be done during, e.g., the manufacturing process as the LNM is assembled and fine tuned.

To reduce levels of free oxygen and other sources of oxygen, e.g., $CO_x$ in the Line Narrowing Modules of, e.g., an excimer of molecular fluorine laser (KrF, ArF, $F_2$) laser in ppm or partial pressure in the gas within the LNM applicants pro[pose to place a photo-ionizable metal, that has a high affinity for oxygen, near the grating in a position to be illuminated by stray laser light, e.g., light reflecting from the grating but not along the optical path back to the beam expander prisms and thereafter to the lasing chamber. This photo-ionizable material, e.g., a suitable metal, when ionized by the DUV light reflecting from the grating, can serve to scavange oxygen from the LNM gas, e.g., by gettering the oxygen when so activated.

As the firing repetition rate of the laser is increased, so will the rate of oxygen gettering. Since the LNP is purged, applicants believe that the oxygen concentration in it is fairly low and uniform distribution within the cavity formed by the LNM housing. Applicants also propose to use an increased surface area, as opposed to simply a flat surface which at some point will cease to be activatable as a getterer, by using, e.g., wire screens, a rough spray coated surface, or a combination of the two, or use an abrasive blasted surface. By keeping oxygen levels low for longer times, this concept should inexpensively extend grating lifetimes.

The metal getter, even one without a roughened or otherwise extended surface area, could be made replaceable element for further enhancement of LNM lifetime. The concept is applicable to other optical elements both within the LNM or elsewhere in the laser system where stray DUV photons can be utilized to activate a getterer.

Figure 18:
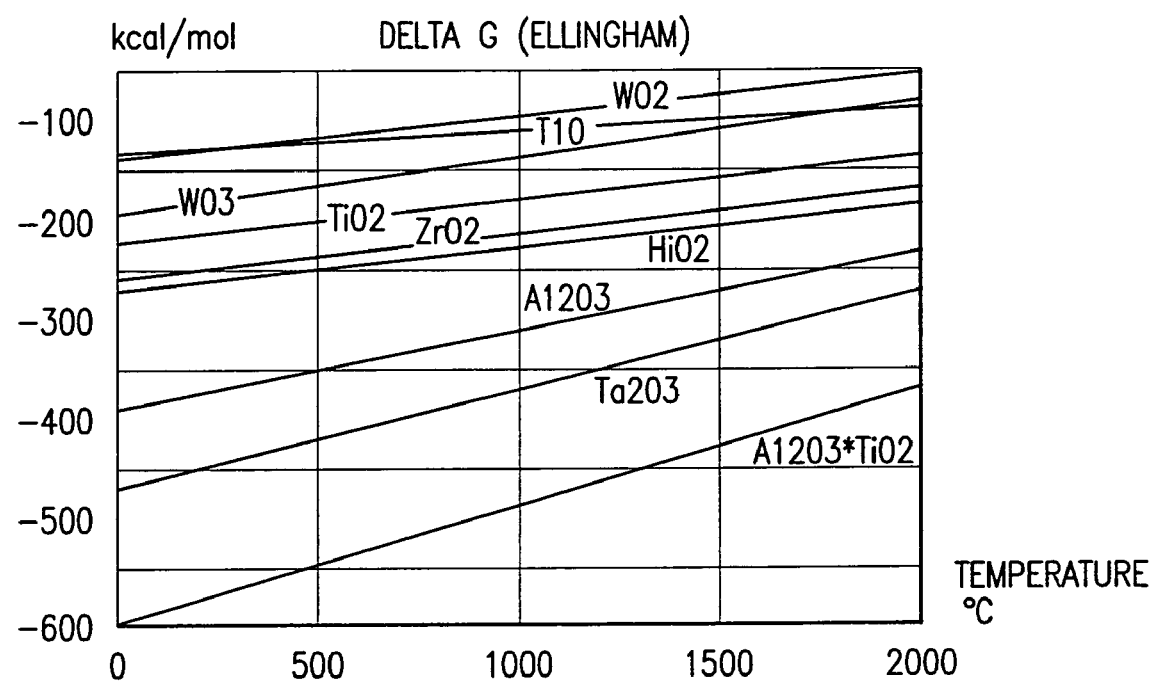

Metals such as Al, Ti, Zr, Ta, W, and Hf are strong oxygen "getters". Ti actually getters many materials and has been used in vacuum systems as a oxygen getter. Most of these metals require at least 6 eV for photo-ionization. That suggests that photons with wavelengths of less than 200 nm may be needed to photo-ionize and activate these metals. For the case of Al (5.96 EeV), 193 NM light can activate it, while 248 nm light may not. Gettering effectiveness vsersus temperature is shown in FIG. 18.

Figure 17:
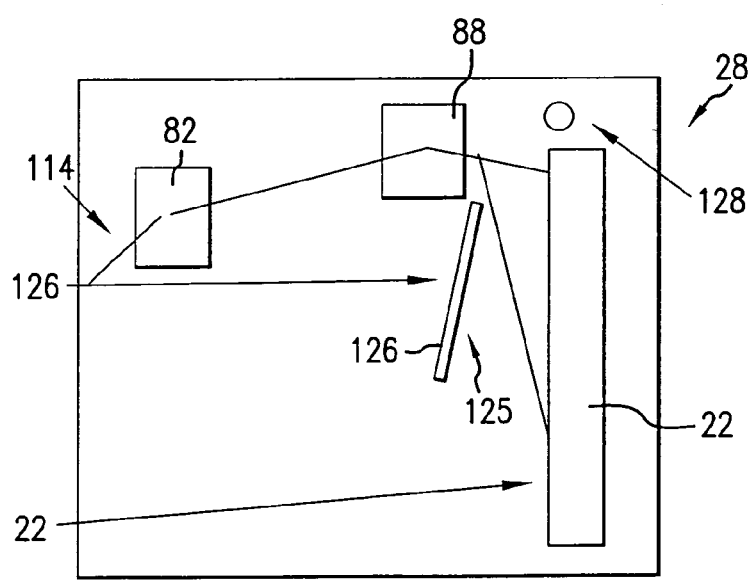
FIG. 17 shows a top plan view partially schematically of aspects of an embodiment of the present invention including an oxygen gettering apparatus; and, FIG. 18 shows a chart of the effectiveness of gettering materials versus temperature.

Applicants further propose that the gettering unit 126 as shown in FIG. 17, e.g., a rectangular solid, which may have smooth or roughened surfaces 125 as discussed above, or a screen and place the gettering unit 126 near the diffraction grating 22 where stray DUV light reflecting from the grating out of the optical path of the beam 114 may be gathered, e.g., on the surface 125. Gettering material may also be placed in other places in the LNM 28, e.g., on the sheet metal forming, e.g., the top and bottom walls 127 of the LNM 28, or in other locations e.g., on surfaces used to block stray light from the beam 114 and or in the path of channel gas flows. When illuminated, the metal will getter oxygen and grow an oxide scale until the surface 127 is saturated. Oxides like aluminum oxide are good diffusion barriers to oxygen since they are naturally compressive. However, oxides like $TiO2$, $HfO2$, $Ta2O5$, and $ZrO2$ are full of defects, tensile (in some cases), and have oxide layers that do not effectively block oxygen diffusion. By using one of these metals, applicants propose to create a longer lasting oxygen getterer that does not saturate as quickly.

Ionization potentials of selected metals are as follows: Al=5.98 eV, Ti=6.82 eV, Ta=7.54 eV, Hf=6.82 eV, Zr=6.63 eV.

Another process that applicants propose is the deposit a suitable metal, e.g., Ti under the Al to coat the grating epoxy. That way dissolved oxygen in the Al would be gettered away (reacted). further, the heating of the aluminum layer of the grating due to DUV absorption can stimulate the amount of gettering accomplished. Also the gettering mechanism 126 may be electrically or RF heated to stimulate the gettering activity.

In addition this technique can be used to clean up the vacuum deposition chamber insides prior to grating Al deposition, thus improving grating quality and lifetime by, e.g., reducing the oxygen impurities in the grating aluminum.

Figure 6:
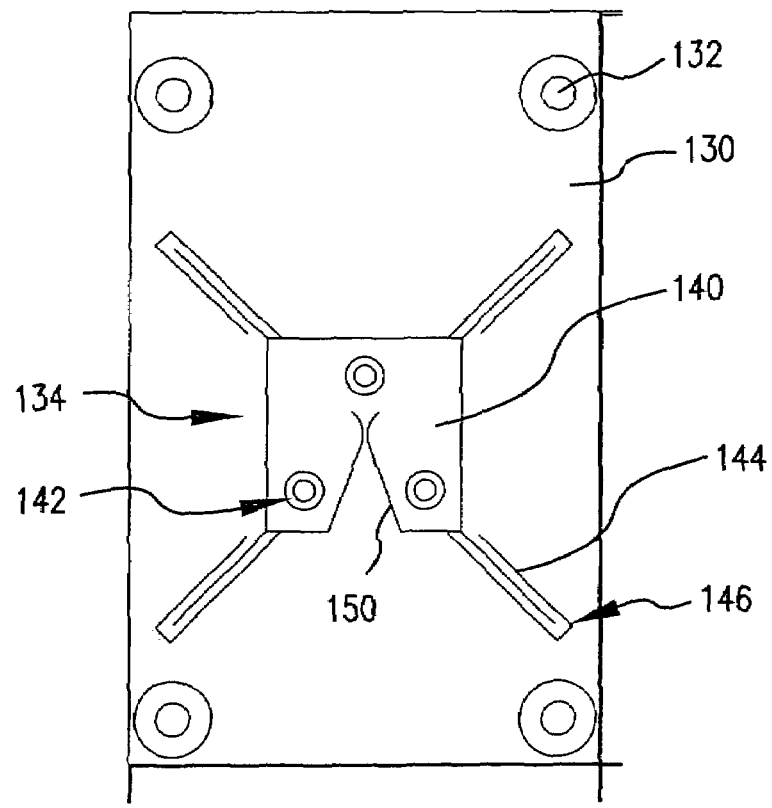
FIG. 6 shows a partially schematic top plan view of a rotational actuator according to aspects of an embodiment of the present invention.
Figure 15:
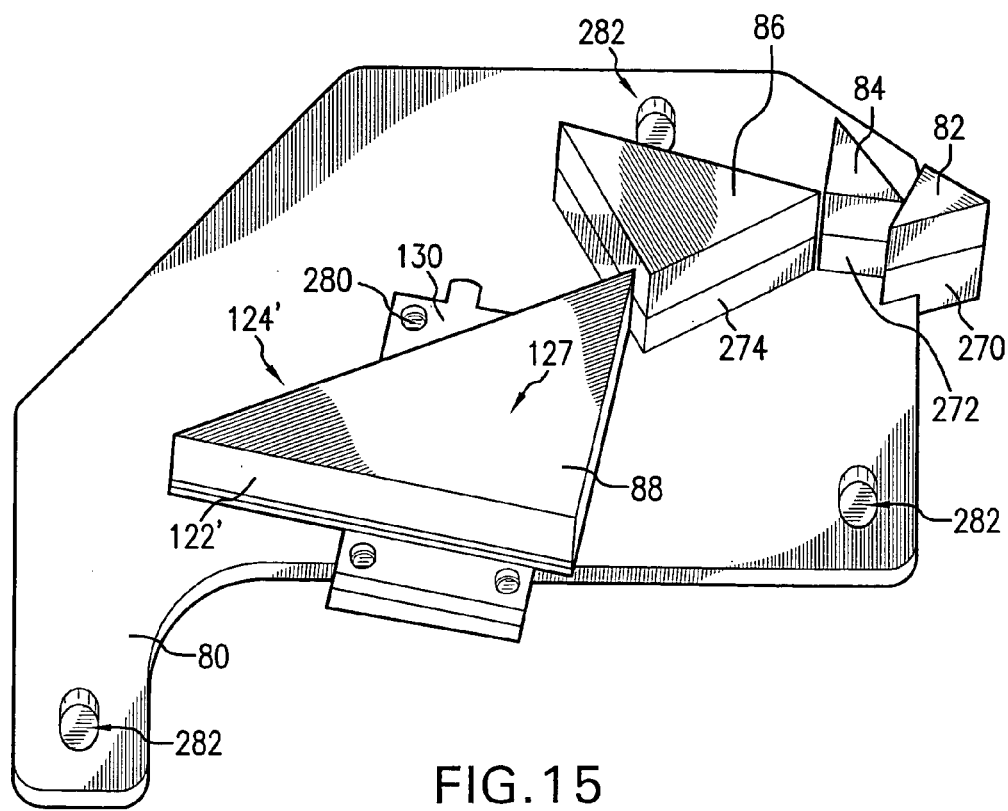
FIG. 15 shows schematically a perspective top view of a prism mounting plate according to aspects of an embodiment of the present invention.
Figure 16:
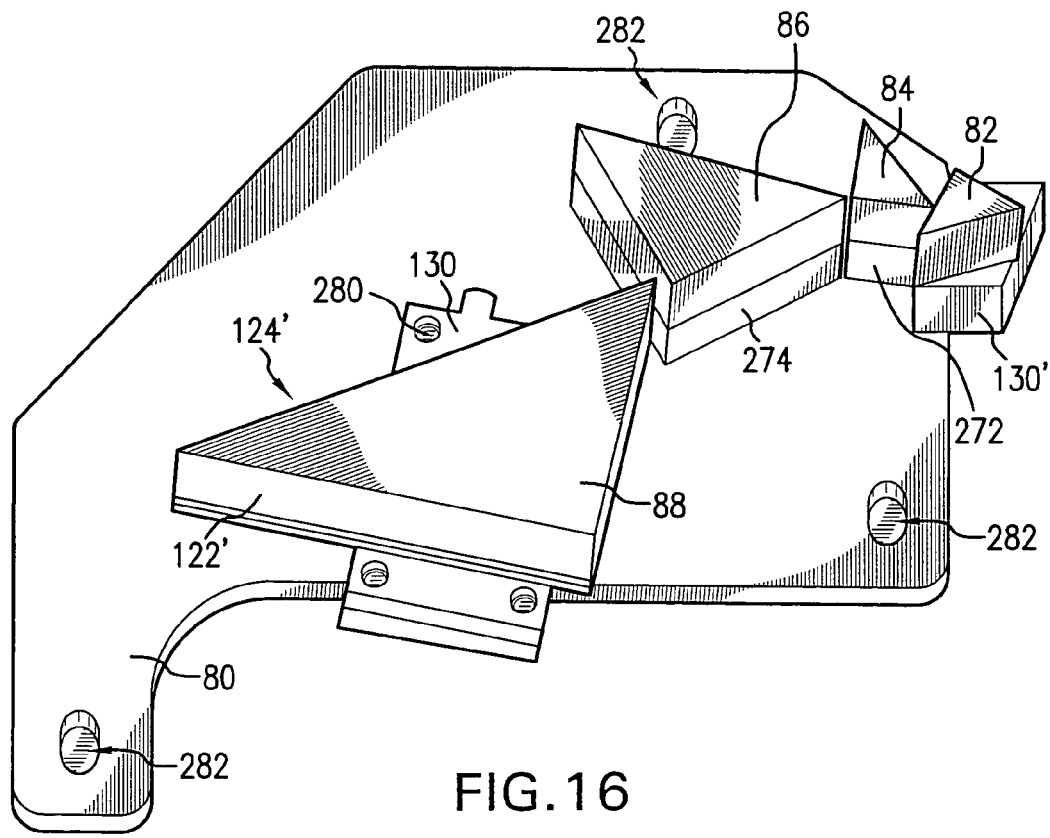
FIG. 16 shows schematically a perspective view of a prism mounting plate according to aspects of an embodiment of the present invention.

Turning now to FIG. 6 there is shown partially schematically a top plan vies of an optical element, e.g., a rotating prism mounting plate 130. The rotating optical element, e.g., a prism, mounting plate 130 may have a plate mounting screw hole 132, through which screws (not shown) may be threaded to mount the mounting plate 130 to, e.g., a prism plate 80 (shown in FIGS. 1, 2, 15 and 16). The rotating mounting plate 130 may have a rotating mount assembly 134, which may include a prism mounting plate 140 and a plurality of prism mounting screw holes 142, through each of which a screw (not shown) may be threaded to attach an optical element, e.g., a prism, e.g., 88 or 82 as shown in FIGS. 15 and 16. The rotating mount assembly 134 may be attached to the mounting plate 140 by a plurality of arms 144 fitted within a respective arm slot 146 in the mounting body 130, one or more of which may comprise an actuatable material that changes size or shape when stimulated by, e.g., a acoustic sound field, and electric field or a magnetic field or combination of any of these, e.g., a piezoelectric material stimulated by an applied voltage.

The rotating mount assembly 134 may include a slot 150, e.g., a V-slot 150 as shown in FIG. 6 which serves to provide a pivot point for the rotation of the platform 130.

The rotating mounting plate 130 may comprise a Nano-Theta provided by Mad City Labs Inc. of Madison, Wis., which is a piezoelectric actuated rotation stage with a well defined and accessible axis of rotation. Threaded screws holes 142 on the rotation stage 134 allow, e.g., a side surface of a prism, e.g., 82-88 to be mounted so that the axis of rotation is, e.g., at one end of a prism beam entrance or exit surface, e.g., a hypotenuse surface, e.g., 124' or a side surface 122' as shown in FIGS. 15 and 16, or generally at the center of rotation 127 of a prism, e.g., prism 88 as shown in FIGS. 15 and 16. The Nano-Theta is capable of sub-microradian resolution in rotational position at which the, e.g., prism is to be moved, for accurate laser beam 114 steering. A piezoresistive sensor (not shown) may be included for absolute measurement and sub-microradian accuracy. The Nano-Thata has a 2.0 mrad range of motion, a 0.02 µrad resolution, is mountable in a variety of possible orientations, has an integrated position sensor(s) for closed loop control and can be custom designed, e.g., with a different size or shape, as may be required for mounting the rotational actuator 130' shown in FIG. 16. The version for FIG. 16 may have the arms 144, e.g., on the left hand side of FIG. 6 moved to not be in alignment with the arms 144 on the right hand side of FIG. 6, in order to make the body 130 thinner in the horizontal direction as that direction id shown in the orientation of the body 130 in FIG. 6. The left hand side arms 144 in the embodiment illustrated in FIG. 16 may extend from the upper and lower horizontal stretches of the opening in which the mount 140 is contained for rotational movement, with, e.g., the upper arm 144 extending vertically as that dimension is illustrated in the drawing of FIG. 6 and the lower left hand side arm 144 may extend at an angle, but not parallel to the upper right hand side arm 144. In this fashion the body 130 may be thinner in the horizontal dimension while retaining most of the flexured mounting of essentially the four corners of the mount 140 to the body 130 to both allow for rotary movement of the mount 140 and act as a restorative spring bias against the motion of the mount 140 imparted by a high frequency drive unit (not shown). The arms 144 in either embodiment may be formed of very thin slots 146 cut, e.g., with an e-beam to form flexured attachment of the mount 140 to the body 130. In a dither mode, e.g., the drive unit (not shown) may use, e.g., a piezoelectric driver operating against a lever arm attached to the mount 140 contained within the body 130, such that high frequency (pulse repetition rate) voltage applied to the piezoelectric driver pushes on the lever arm (not shown) to rotate the mount 140 a selected amount determined, e.g., by the amplitude of the applied voltage pulse and the arms 144 may then return the mount 140 (and the attached tuning mechanism, e.g., a prism 88) to a home position. In another form of operation, the voltage may be controlled, e.g., on a laser light pulse to pulse basis with a variable applied voltage amplitude for center wavelength adjustment as discussed above.

Figure 7:
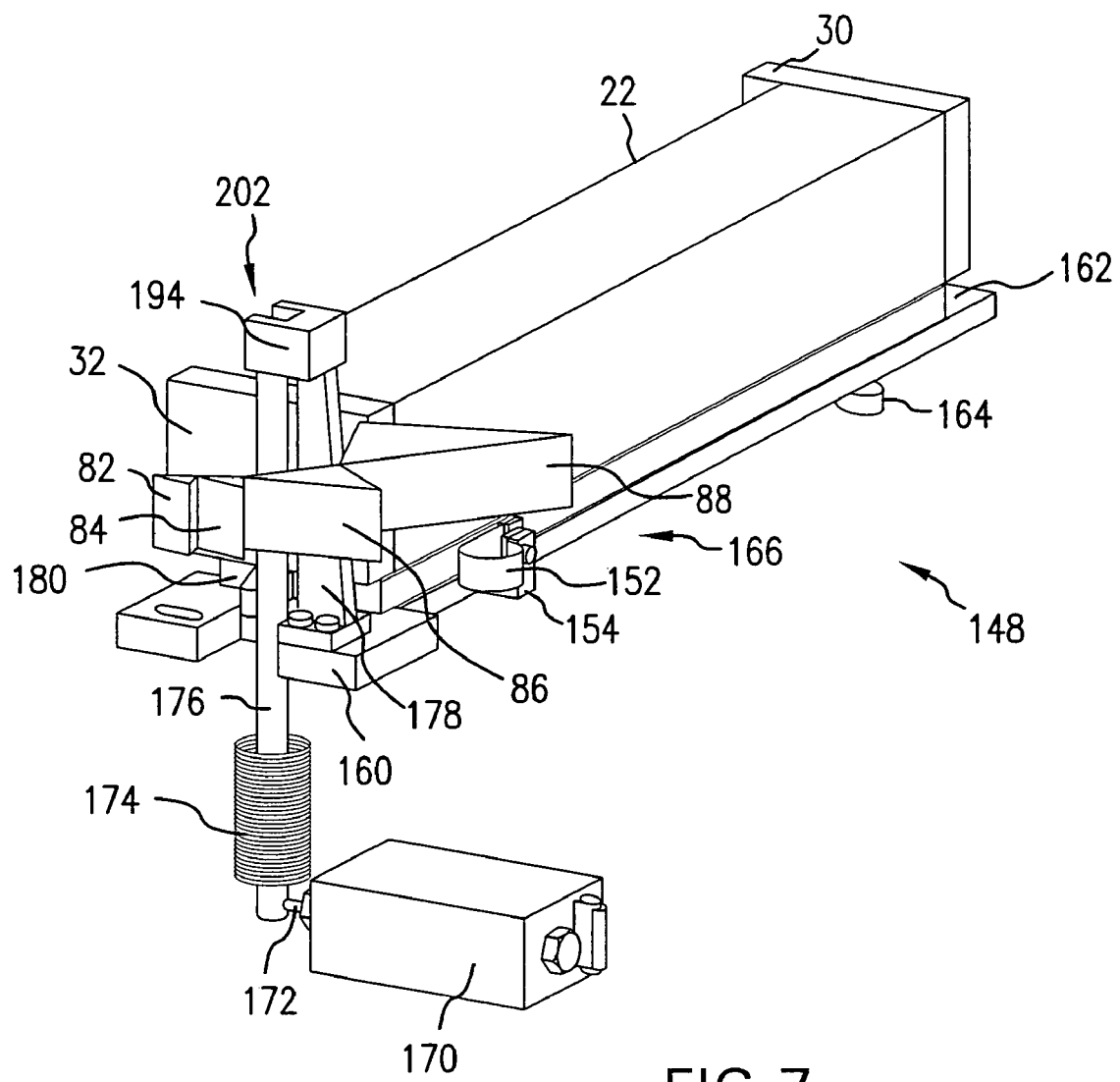
FIG. 7 shows a partially schematic perspective front view of a grating rotating mechanism according to aspects of an embodiment of the present invention.
Figure 8:
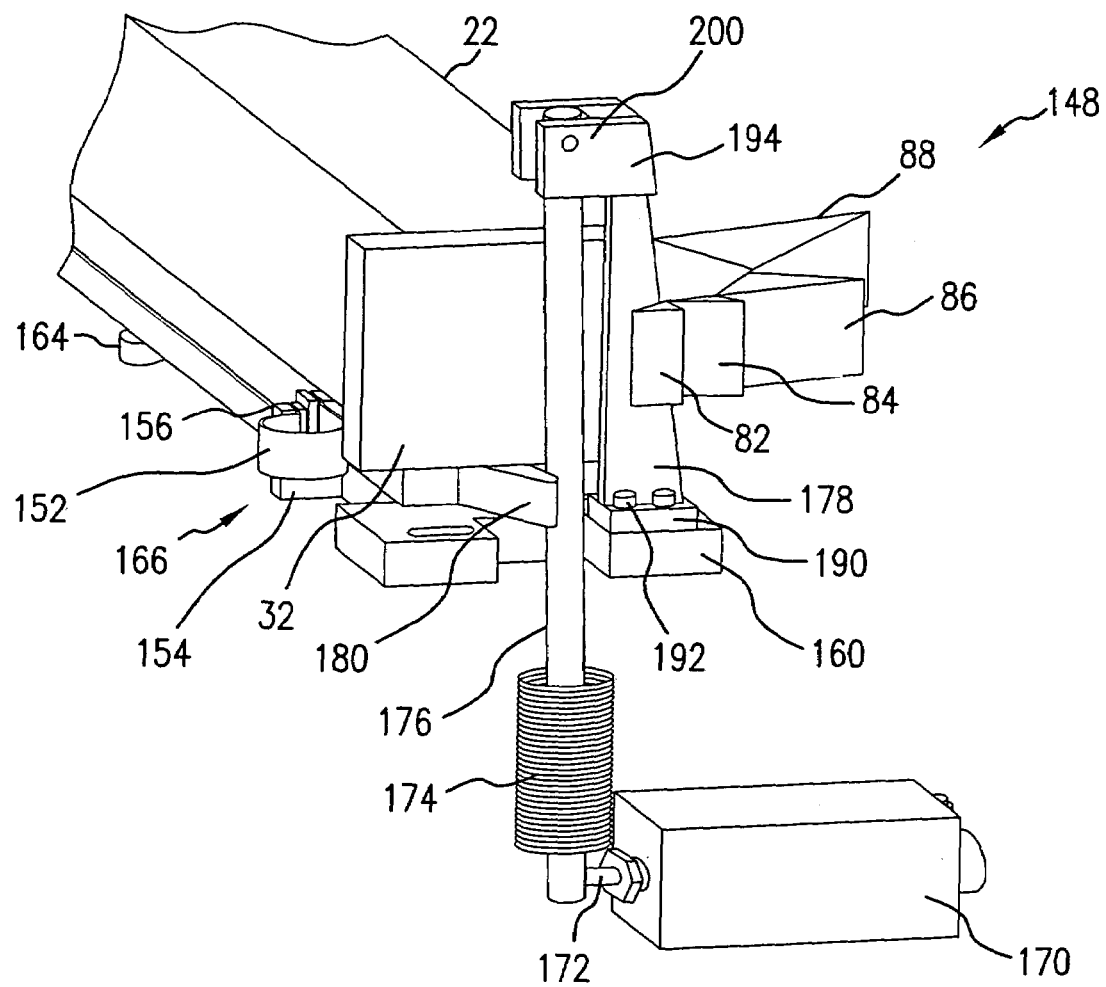
FIG. 8 shows a perspective side view of the grating rotating mechanism according to FIG. 7.
Figure 9:
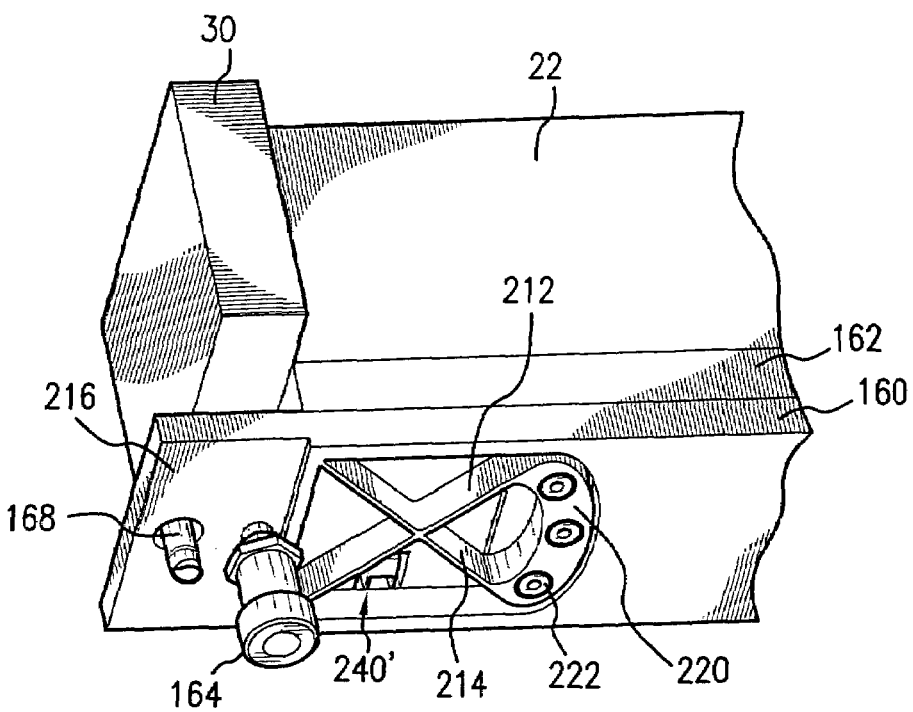
FIG. 9 shows a more detailed perspective bottom rear view of the grating rotating mechanism according to FIG. 7.
Figure 10A:
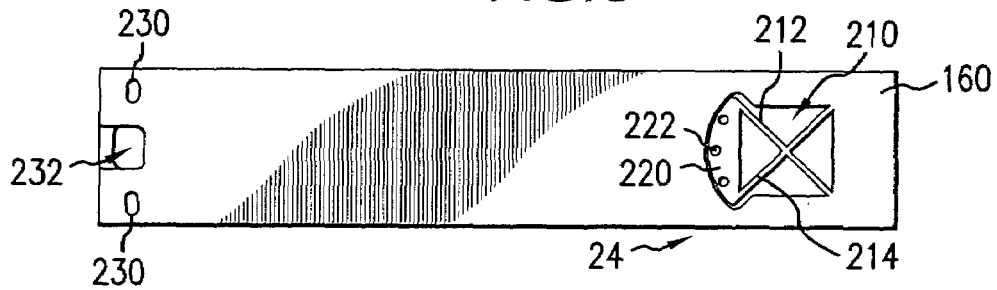
FIGS. 10A-C show, respectively, a plan top, side and bottom view of a grating base plate according to aspects of an embodiment of the present invention's grating rotating mechanism according to FIG. 7.
Figure 10B:
Figure 10C:
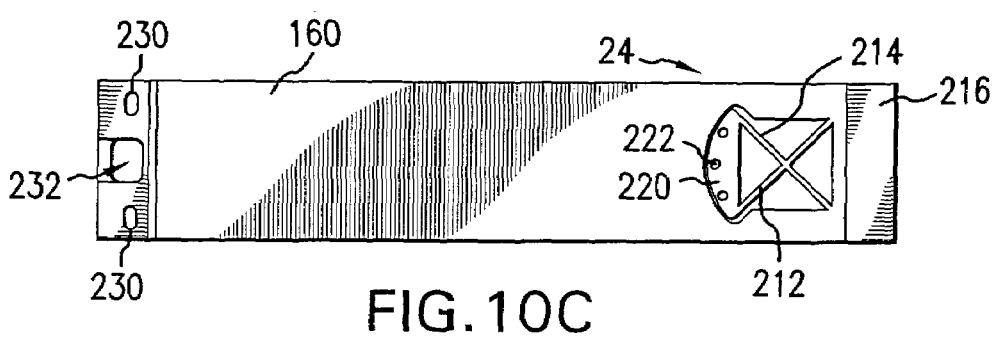

Turning now to FIGS. 7 and 8 there is shown perspective front and side views, respectively, of a rotatable grating assembly 148 according to aspects of an embodiment of the present invention. The rotatable grating assembly 148 may comprise a grating 22, which may be mounted on a grating base plate 162, which may in turn be mounted on a grating mounting plate 160, as described in more detail below with respect to FIGS. 9-12. A pair of spring mounting assemblies 166, comprising a pair of band springs 152, front and back, may be connected to a respective band spring mounting plate 158, each respectively connected to the front and rear of, e.g., the grating base plate 162. The other end of each respective band spring 152 may be connected to a respective band spring stanchion 156, connected respectively to the housing 62 of the LNM 28, e.g., the floor of the housing 64. The band springs 152 may be connected to the respective mounting plate 158 and stanchion 156 by any suitable means, e.g., by welding or by screws, including a combination of wedging and/or screw connection to a receiving slot (not shown) on the respective plate 158 or stanchion 156. The band springs may serve to bias the grating into a position, e.g., a nominal position in which currently existing non-rotatable gratings 22 are positioned, e.g., with respect to the incident laser light pulse beam pulses 114.

The grating 22 along with the mounting plate 160 and the grating base plate 162 may be rotated against the biasing of the band springs 152 and about a pivot point as defined in more detail below, e.g., defining a rotational axis for the rotatable grating 22. An adjustment screw 164 (shown in FIGS. 7-9) may serve to fine tune the alignment of the grating 22 dispersive surface 27 to the incident beam 114, e.g., leaving a side face 122' of a beam expander prism, e.g., prism 88 in a direction generally orthogonal to the longitudinal extension of the grating 22 dispersive surface 27.

A stepper motor 170 may serve to coarsely position the grating 22 about the pivot axis at the fulcrum by, e.g., operating to move a stepper motor shaft 172, e.g., in a horizontal direction as that direction is illustrated in FIGS. 7 and 8. The stepper motor shaft 172 may be located to move one end of a lever arm 176, surrounded by a bellows 174, shown schematically in FIGS. 7 and 8, which can allow the lever arm 176 to pass through the LNM enclosure, e.g., through the LNM 28 floor, where the stepper motor 170 is positioned externally to the LNM 28. The one end of the lever arm 176 moves in the same illustrated horizontal direction which in turn drives the other end of the lever arm 176, pivoting about a fulcrum point 189 on a protrusion extending from the grating base plate 162. This then exerts a force on a pivot stanchion 178 mounted on the grating mounting plate 160 by a stanchion base plate 190 by mounting screws 192, and so moves the base plate 162 in the opposite direction with respect to the mounting plate 160 to rotate the grating 22 along with the base plate 162 about the pivot point for the rotation of the grating. This operation is against the positional bias offered by the band spring assemblies 166. The The other end of the lever arm 176 may be pivotally attached to the stanchion 178 by a attaching the lever arm to a stanchion head 194 of the stanchion 178 with a pivot pin 200 passing through a lever arm pivot assembly 202 on the stanchion head 194.

Turning now to FIGS. 9 and 10A-C there is shown a cartwheel flexure mounting 210 connecting the grating mounting plate 160 to the grating base plate 162 at the pivot point 168 end of the grating 22, and allowing rotation of the grating 22 and the base plate 162 together with respect to the grating mounting plate 160, and also serving to reinforce the biasing of the band spring assemblies 166. The cartwheel flexure mount 210 may comprise a first cross arm 212 and a second cross arm 214, which together are relatively stiff in the longitudinal axis of the flexure mount 210, aligned generally with the longitudinal axis of the grating 22, and relatively flexible to rotation of the grating base plate with respect to the grating mounting plate 160 about the pivot point, which is generally at the intersection of the first and second cross arms 212, 214. A mounting arc 220 stiffens the cartwheel flexure mount 210 in the lateral direction and also serves to connect the cartwheel flexure mount 210 to the grating base plate 162, by screws 222 threaded through screw holes 230 and into the grating base plate 162. The grating mounting plate 160 and grating base plate 162 along with the screws 222 are preferably made of the same material or materials having very similar coefficients of thermal expansion, e.g., Invar or Al.

A shelf 216 on the grating mounting plate 160 facing the housing 64 of the LNM 28 serves as a contact point for the positioning screw/micrometer 164 and contains an opening for a hold down spring 168, and also can be used, e.g., to position the mounting plate 160 properly with respect to the floor of the LNM 28 housing 62.

Figure 11A:
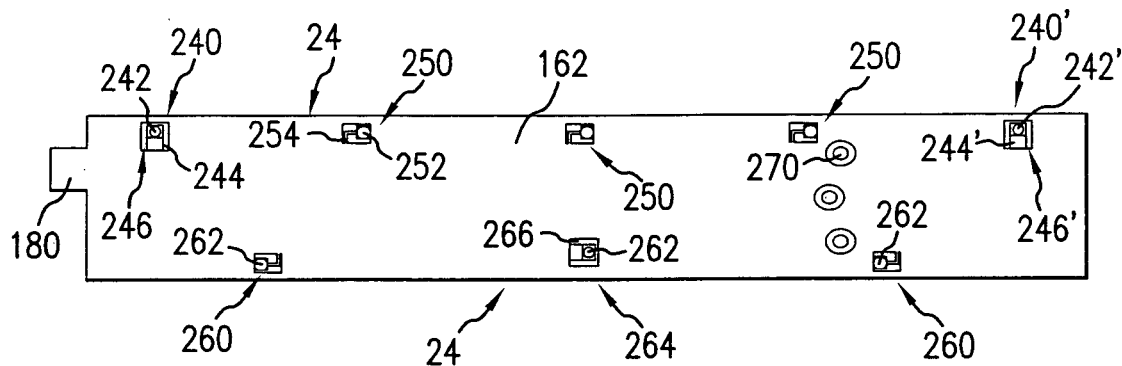
FIGS. 11A and 11B show, respectively a plan top and side view of a grating mounting plate according to aspects of an embodiment of the present invention's grating rotating mechanism according to FIG. 7.
Figure 11B:
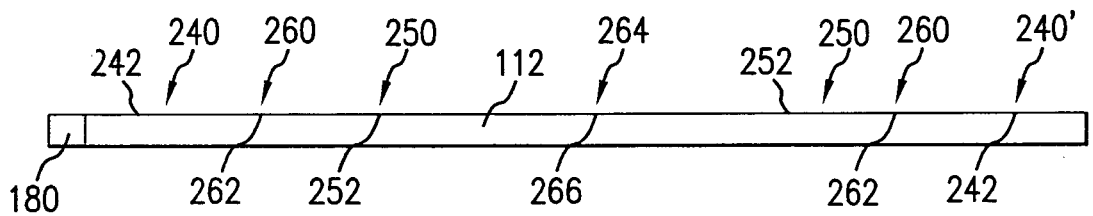

The grating itself may be attached to the grating base plate 162 by a plurality of front flexure mounts, e.g., including a plurality of front longitudinal (horizontal) flexure mounts 240, 240' each having a front longitudinal flexure mounting pad 242, 242', as shown in FIGS. 11A and B. The plurality of front bi-directional flexure mounts 250 each having a front bi-directional flexure mounting pad 252 also serve to connect the grating 22 to the grating base plate 162. In addition the grating 22 may be connected to the grating base plate 162 by a plurality of rear flexure mountings, including, e.g., rear bi-directional flexure mountings 260 having mounting pads 262 and a rear lateral (vertical) flexure mount 264 having a mounting pad 266. together these mounting points distribute the potential stresses of mounting points between the grating 22 and the base plate 162 and provide for the front portion of the grating 22/base plate 162 mounting (at the grating 22 dispersive optical surface 24 side) relatively more amenable to movement between the grating 22 and the base plate 162 along the longitudinal axis especially at the ends to which the end plated 30, 32 are connected, and the rear side relatively more amenable to movement of the one with respect to the other in the transverse direction.

Figure 14:
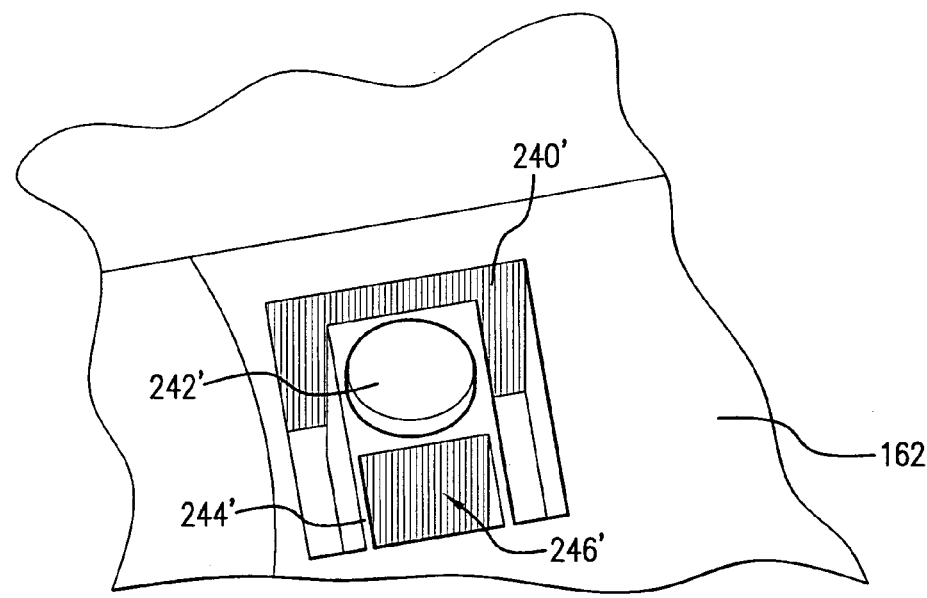
FIG. 14 shows in more detail a flexure mounting according to aspects of an embodiment on the present invention contained on the mounting plate according to FIG. 11.

FIG. 14 shows in more detail the front forward longitudinal flexure mount 240' and exemplary displacement magnitudes, e.g., for the flexure arms 244' within the respective opening 246' in the base plate 162 forming the flexure mounting pad 242' and flexure arms 244'.

Figure 12:
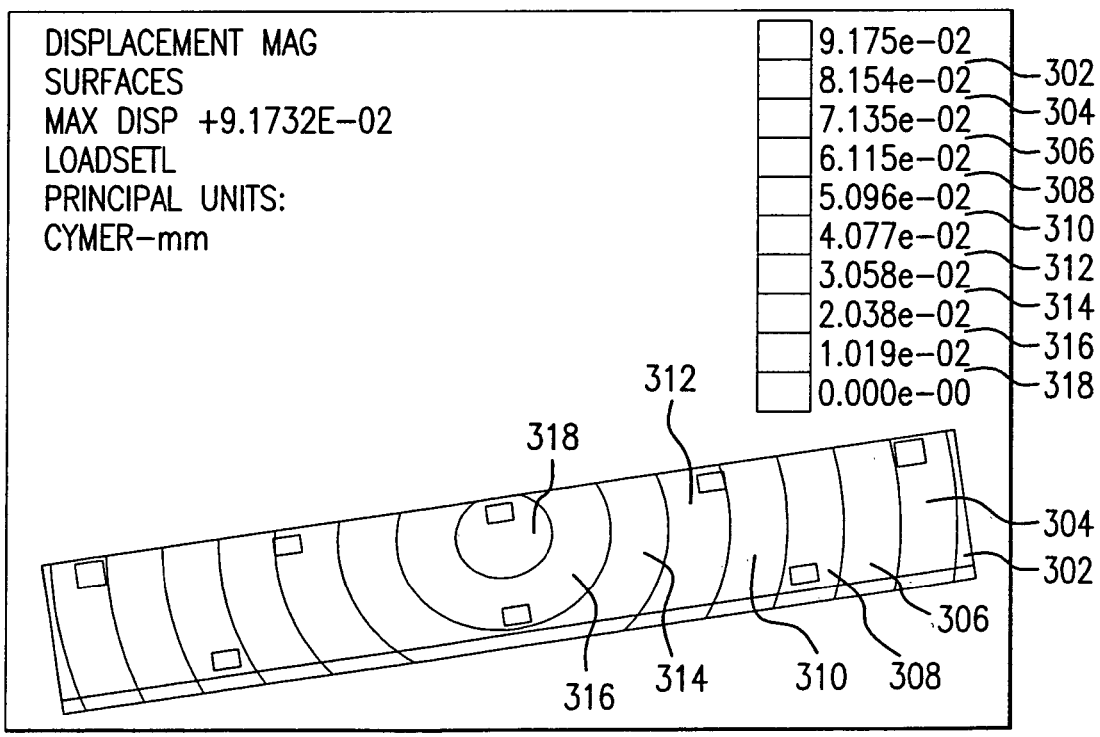
FIG. 12 shows a map of displacement magnitudes of the mounting plate of FIGS. 11A and B.

FIG. 12 shows zones of respective grating displacement magnitude 300-318 for a representative grating base plate 162.

Figure 13:
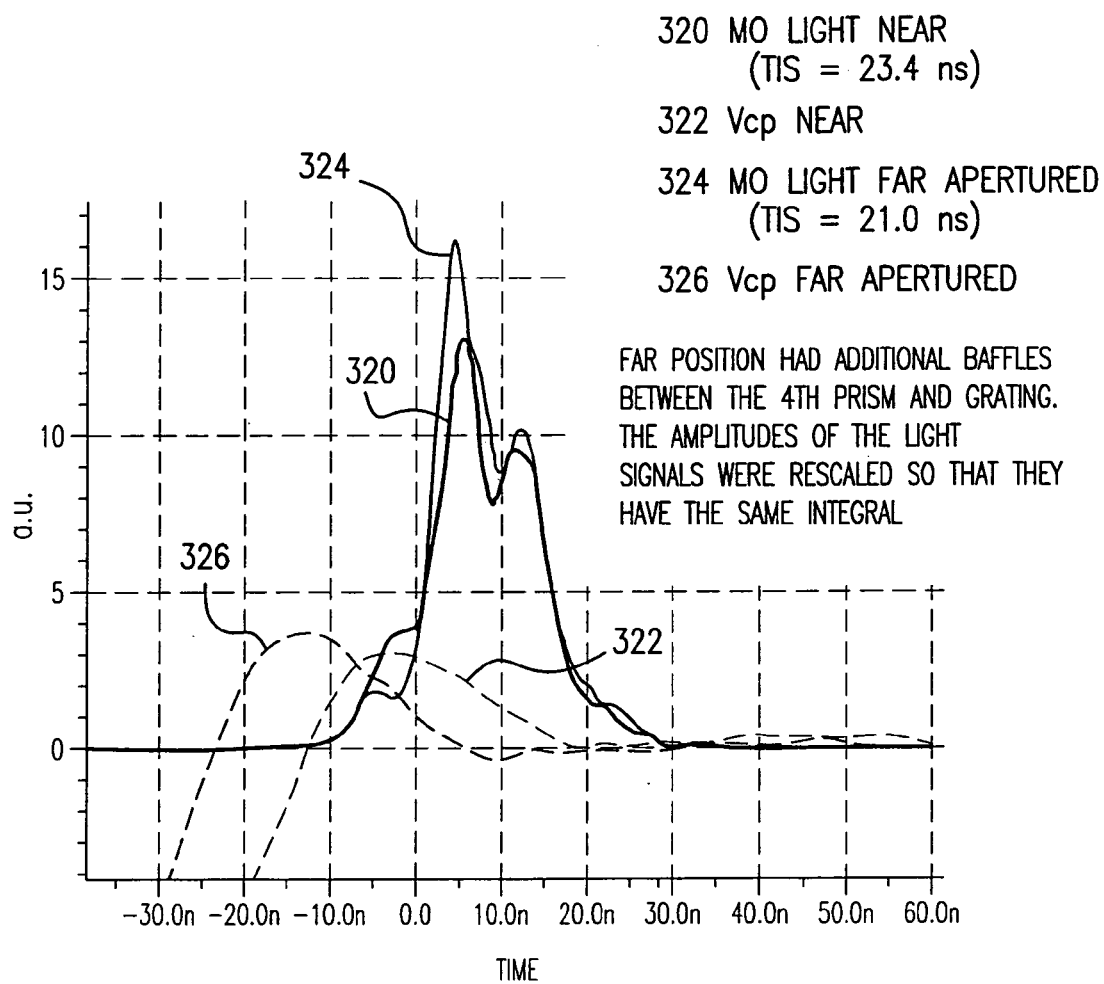
FIG. 13 shows the light output of a gas discharge laser system oscillator cavity as a function of time.

FIG. 13 shows the output

Turning now to FIGS. 15 and 16, there is shown partly schematically a perspective view of a prism mounting plate 80 for an LNM 28 enabling rotation of at least one prism (FIG. 15) and at least two prisms (FIG. 16) for, e.g., coarse and fine control of the center wavelength of a laser system as discussed above. The prism plate shown in FIG. 15 may comprise four prisms 82-88 in a beam expansion path 114 from prism 82 through prism 88, each prism 82-88 being mounted on a respective prism mounting plate 270, 272, 274 and 130, with the laser mounting plate 130 being a rotational actuation mounting plate 130 as described above with respect to FIG. 6.

In FIG. 16 there is an additional rotational mounting plate 130', e.g., connected to prism 82, which may be mounted as shown in FIG. 16 partially to the prism plate 80 and partly to surrounding structures, e.g., the floor of the LNM 28 housing 62 and/or the side wall of the housing 62 and/or an adjacent module or interface module to the LNM 28 where the beam 114 enters the LNM 28.

The base plate 80 may be adjustably (in the grating longitudinal direction) to the LNM 28 floor of the housing 62 by screws of bolts (not shown) attached through the elongated parallel openings 282.

It will be understood by those skilled in the art that according to aspects of embodiments of the present invention the overall efficiency of the laser system over prior art laser systems is improved in many ways. The elimination of a tuning mechanism involving the use of a tuning mirror, e.g., an $R_{MAX}$ as employed in laser systems sold by applicants' assignee Cymer, Inc., e.g., in models 7XXX and XLA-XXX laser systems. This has several beneficial efficiency improvement effects, e.g., shortening the length of the laser resonance cavity wherein the line narrowing module is utilized to perform intra-cavity line narrowing, and removing the loss of efficiency due to the $R_{MAX}$ so dubbed for being "maximally" reflective at the nominal center wavelength, though actually only being about 90% so reflective and being in the optical path of the line narrowing module twice, on ingress and egress of the beam being line narrowed. In addition the beam expander is in the optical path for a purpose better utilization of the grating with an expanded beam that is also less divergent than the unexpanded beam produced in the lasing chamber between the lasing electrodes in the gas lasing medium and its utilization also to select the center wavelength improves on efficiency, i.e., no added optical elements are needed.

The center wavelength selection is also improved since removing the extra optical element(s) used for center wavelength tuning removes the adverse effect of the optical element on the uniformity of the wavefront that reaches the grating, e.g., due to non-uniformities in the surface of the $R_{MAX}$ due to either manufacturing non-uniformities and/or environmentally induced distortions, e.g., thermally induced non-uniformities.

Currently gratings used in line narrowing modules are illuminated in a longitudinal axis of the grating covering essentially all of the longitudinal length of the grating, in order, e.g., to maximize the bandwidth selection done by the grating. At the same time, however, the grating is typically not being utilized in the transverse or lateral direction of the grating across the full width of the grating. The laser beam width on the grating (or at least the damage footprint at end of life) in a typical line narrowing module, e.g., in applicants' assignee's 7XXX and/or XLA-XXX laser systems is only about 1 cm wide, while the grating is over three times as wide, e.g., about 3.5 cm. Gratings for several reasons, e.g., ease of manufacture, thermal mass stability, reaction to thermal gradient distortions, etc. are made several times wider than the actual real estate needed to receive and reflect the laser beam in the line narrowing process.

It will be understood that according to aspects of embodiments of the present invention an elongated grating 22 LNM 28 may be implemented, which is among other things without a tuning mechanism, i.e., $R_{MAX}$, thereby saving space, e.g., by controlling bandwidth in feedback closed loop control, e.g., with a coarse control using one optical element, e.g., the grating itself or a beam expansion prism and finely with a beam expansion prism, thereby saving both space but also bulk that must be moved for bandwidth fine control at very high pulse repetition rates. Larger magnification may also be accommodated without having to also provide a suitably larger reflective surface on the existing $R_{MAX}$.

In one possible arrangement, e.g., a four prism LNM 28 three may be fixed, e.g., with the first two in the optical path being ½ inch prisms and the third a 32 mm prism giving a relatively higher magnification factor than existing four prism LNM's 28. Utilizing the first two smaller prisms and third higher magnification prism for the higher magnification factor, with or without the absence of an RMAX makes the beam expansion assembly more compact. Also using a higher angle (e.g., 74.4°) of incidence can enable getting increases in magnification. The fourth prism can be, e.g., a 70 mm and mounted on a rotating stage that is PZT actuated, including a flexure mounting, also accommodating frictionless rotation. With the built in sensor in the flexure mounting stage there can be closed loop, i.e., within the mount to linearize the rotational stage, unlike existing open loop systems. Utilizing linear feedback also allows for the feedback to be accomplished without optical feedback from, e.g., a laser beam metrology module, e.g. the LAM's currently used in applicants' assignee's laser systems. Linearization can provide a position error, e.g., from a lookup table that provide positional information about the position of the prism, which may be changed as necessary for changes over prism life and with gas temperature or the like. Up to, e.g., about a 360 mm long grating can be accommodated, especially with the use of the flexures as discussed above and the tilt adjuster to align the beam to the grating. The added number of glue spots on the plurality of flexure mounting pads can accommodate a rating weight which may be up to about twice as heavy (or more) as currently used shorter gratings and also eliminating glue spots not on flexure pads is helpful. The three single axis flexure mounts discussed above restrain the grating in one respective direction (longitudinal or transverse) to keep the grating restrained from wobble and the others flex in two axes.

We claim:

1. A line narrowing module for a narrow band DUV high power high repetition rate gas discharge laser producing output laser light pulse beam pulses in bursts of pulses, the module having a nominal optical path, comprising:

a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic;

a first tuning mechanism operative in part to select the angle of incidence of the laser light pulse beam containing the respective pulse upon the dispersive center wavelength selection optic, by selecting an angle of transmission of the laser light pulse beam containing the pulse toward the dispersive center wavelength selection optic;

a second tuning mechanism operative in part to select the angle of incidence of the laser light pulse beam containing the respective pulse by changing the position of the dispersive center wavelength selection optic relative to the nominal optical path of the line narrowing module;

wherein the second tuning mechanism coarsely selects a value for the center wavelength and the first tuning mechanism more finely selects the value for the center wavelength.

2. The apparatus of claim 1 further comprising:

at least one beam expanding and redirecting prism in the optical path of the line narrowing module;

the first tuning mechanism selecting an angle of incidence of the at least a first spatially defined portion of the laser light pulse beam by changing the position of the at least one beam expanding prism relative to the nominal optical path of the line narrowing module.

3. The apparatus of claim 1 further comprising:

the first and second tuning mechanisms are controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

4. The apparatus of claim 2 further comprising:

the first and second tuning mechanisms are controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

5. The apparatus of claim 1 further comprising:

the first tuning mechanism comprises an electro-mechanical course positioning mechanism and a fine positioning mechanism comprising an actuatable material that changes position or shape when actuated.

6. The apparatus of claim 2 further comprising:

the first tuning mechanism comprises an electro-mechanical course positioning mechanism and a fine positioning mechanism comprising an actuatable material that changes position or shape when actuated.

7. The apparatus of claim 3 further comprising:

the first tuning mechanism comprises an electro-mechanical course positioning mechanism and a fine positioning mechanism comprising an actuatable material that changes position or shape when actuated.

8. The apparatus of claim 4 further comprising:

the first tuning mechanism comprises an electro-mechanical course positioning mechanism and a fine positioning mechanism comprising an actuatable material that changes position or shape when actuated.

9. The apparatus of claim 5 further comprising:

the actuatable material is selected from a group consisting of electro-actuatable, magneto-actuatable and acousto-actuatable materials.

10. The apparatus of claim 6 further comprising:

the actuatable material is selected from a group consisting of electro-actuatable, magneto-actuatable and acousto-actuatable materials.

11. The apparatus of claim 7 further comprising:

the actuatable material is selected from a group consisting of electro-actuatable, magneto-actuatable and acousto-actuatable materials.

12. The apparatus of claim 8 further comprising:

the actuatable material is selected from a group consisting of electro-actuatable, magneto-actuatable and acousto-actuatable materials.

13. The apparatus of claim 9 further comprising:

the actuatable material comprises a piezoelectric material.

14. The apparatus of claim 10 further comprising:

the actuatable material comprises a piezoelectric material.

15. The apparatus of claim 11 further comprising:

the actuatable material comprises a piezoelectric material.

16. The apparatus of claim 12 further comprising:

the actuatable material comprises a piezoelectric material.

17. A line narrowing module for a narrow band DUV high power high repetition rate gas discharge laser producing output laser light pulse beam pulses in bursts of pulses, the module having a nominal optical path, comprising:

a dispersive center wavelength selection optic fixedly mounted along an optical path of the line narrowing module, selecting at least one center wavelength for each pulse determined at least in part by the angle of incidence of the laser light pulse beam containing the respective pulse on a dispersive wavelength selection optic;

a first tuning mechanism operative in part to select an angle of incidence of the laser light pulse beam containing the respective pulse upon the dispersive center wavelength selection optic, by selecting an angle of transmission of the laser light pulse beam containing the pulse toward the dispersive center wavelength selection optic;

a second tuning mechanism operative in part to select at least one angle of incidence of the laser light pulse beam containing the respective pulse by changing the angle of transmission of at least a spatially defined portion of the laser light pulse beam containing the pulse toward the first tuning mechanism;

wherein the first tuning mechanism coarsely selects a value for the center wavelength and the second tuning mechanism more finely selects the value for the center wavelength.

18. The apparatus of claim 17 further comprising:

the first and second tuning mechanisms comprising independently selectively refracting optical elements;

the first and second tuning mechanisms selecting an angle of incidence of the laser light pulse beam on the dispersive optical element by changing the respective position of the first beam expanding mechanism and the second beam expanding mechanism relative to the nominal optical path of the line narrowing module.

19. The apparatus of claim 17 further comprising:

the first and second tuning mechanisms are controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

20. The apparatus of claim 18 further comprising:
the first and second tuning mechanisms are controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

21. The apparatus of claim 17 further comprising:
the first and second tuning mechanisms each comprise an electro-mechanical course positioning mechanism and a fine positioning mechanism comprising an actuatable material that changes position or shape when actuated.

22. The apparatus of claim 18 further comprising:
the first and second tuning mechanisms each comprise an electro-mechanical course positioning mechanism and a fine positioning mechanism comprising an actuatable material that changes position or shape when actuated.

23. The apparatus of claim 19 further comprising:
the first and second tuning mechanisms each comprise an electro-mechanical course positioning mechanism and a fine positioning mechanism comprising an actuatable material that changes position or shape when actuated.

24. The apparatus of claim 20 further comprising:
the first and second tuning mechanisms each comprise an electro-mechanical course positioning mechanism and a fine positioning mechanism comprising an actuatable material that changes position or shape when actuated.

25. The apparatus of claim 21 further comprising:
the actuatable material is selected from a group consisting of electro-actuatable, magneto-actuatable and acousto-actuatable materials.

26. The apparatus of claim 22 further comprising:
the actuatable material is selected from a group consisting of electro-actuatable, magneto-actuatable and acousto-actuatable materials.

27. The apparatus of claim 23 further comprising:
the actuatable material is selected from a group consisting of electro-actuatable, magneto-actuatable and acousto-actuatable materials.

28. The apparatus of claim 24 further comprising:
the actuatable material is selected from a group consisting of electro-actuatable, magneto-actuatable and acousto-actuatable materials.

29. The apparatus of claim 25 further comprising:
the actuatable material is a piezoelectric material.

30. The apparatus of claim 26 further comprising:
the actuatable material is a piezoelectric material.

31. The apparatus of claim 27 further comprising:
the actuatable material is a piezoelectric material.

32. The apparatus of claim 28 further comprising:
the actuatable material is a piezoelectric material.

33. The apparatus of claim 17 further comprising:
the first and second tuning mechanisms each comprise a beam expanding prism.

34. The apparatus of claim 18 further comprising:
the first and second tuning mechanisms each comprise a beam expanding prism.

35. The apparatus of claim 19 further comprising:
the first and second tuning mechanisms each comprise a beam expanding prism.

36. The apparatus of claim 20 further comprising:
the first and second tuning mechanisms each comprise a beam expanding prism.

37. The apparatus of claim 21 further comprising:
the first and second tuning mechanisms each comprise a beam expanding prism.

38. The apparatus of claim 22 further comprising:
the first and second tuning mechanisms each comprise a beam expanding prism.

39. The apparatus of claim 23 further comprising:
the first and second tuning mechanisms each comprise a beam expanding prism.

40. The apparatus of claim 24 further comprising:
the first and second tuning mechanisms each comprise a beam expanding prism.

41. The apparatus of claim 25 further comprising:
the first and second tuning mechanisms each comprise a beam expanding prism.

42. The apparatus of claim 26 further comprising:
the first and second tuning mechanisms each comprise a beam expanding prism.

43. The apparatus of claim 27 further comprising:
the first and second tuning mechanisms each comprise a beam expanding prism.

44. The apparatus of claim 28 further comprising:
the first and second tuning mechanisms each comprise a beam expanding prism.

45. The apparatus of claim 29 further comprising:
the first and second tuning mechanisms each comprise a beam expanding prism.

46. The apparatus of claim 30 further comprising:
the first and second tuning mechanisms each comprise a beam expanding prism.

47. The apparatus of claim 31 further comprising:
the first and second tuning mechanisms each comprise a beam expanding prism.

48. The apparatus of claim 32 further comprising:
the first and second tuning mechanisms each comprise a beam expanding prism.

49. The apparatus of claim 17 further comprising:
the first tuning mechanism comprising a first angle of transmission selection mechanism comprises of an electro-mechanical positioning mechanism without a fine tuning positioning mechanism;
the second tuning mechanism comprising a second angle of transmission selection mechanism comprises an actuated material positioning mechanism without a course tuning positioning mechanism.

50. The apparatus of claim 18 further comprising:
the first tuning mechanism comprising a first angle of transmission selection mechanism comprises of an electro-mechanical positioning mechanism without a fine tuning positioning mechanism;
the second tuning mechanism comprising a second angle of transmission selection mechanism comprises an actuated material positioning mechanism without a course tuning positioning mechanism.

51. The apparatus of claim 19 further comprising:
the first tuning mechanism comprising a first angle of transmission selection mechanism comprises of an electro-mechanical positioning mechanism without a fine tuning positioning mechanism;
the second tuning mechanism comprising a second angle of transmission selection mechanism comprises an actuated material positioning mechanism without a course tuning positioning mechanism.

52. The apparatus of claim 20 further comprising:
the first tuning mechanism comprising a first angle of transmission selection mechanism comprises of an electro-mechanical positioning mechanism without a fine tuning positioning mechanism;
the second tuning mechanism comprising a second angle of transmission selection mechanism comprises an actuated material positioning mechanism without a coarse tuning positioning mechanism.

53. The apparatus of claim 49 further comprising:
the actuatable material positioning mechanism comprising an actuatable material that changes position or shape when actuated.

54. The apparatus of claim 50 further comprising:
the actuatable material positioning mechanism comprising an actuatable material that changes position or shape when actuated.

55. The apparatus of claim 51 further comprising:
the actuatable material positioning mechanism comprising an actuatable material that changes position or shape when actuated.

56. The apparatus of claim 52 further comprising:
the actuatable material positioning mechanism comprising an actuatable material that changes position or shape when actuated.

57. The apparatus of claim 53 further comprising:
the actuatable material is selected from a group consisting of electro-actuatable, magneto-actuatable and acousto-actuatable materials.

58. The apparatus of claim 54 further comprising:
the actuatable material is selected from a group consisting of electro-actuatable, magneto-actuatable and acousto-actuatable materials.

59. The apparatus of claim 55 further comprising:
the actuatable material is selected from a group consisting of electro-actuatable, magneto-actuatable and acousto-actuatable materials.

60. The apparatus of claim 56 further comprising:
the actuatable material is selected from a group consisting of electro-actuatable, magneto-actuatable and acousto-actuatable materials.

61. The apparatus of claim 57 further comprising:
the actuatable material comprises a piezoelectric material.

62. The apparatus of claim 58 further comprising:
the actuatable material comprises a piezoelectric material.

63. The apparatus of claim 59 further comprising:
the actuatable material comprises a piezoelectric material.

64. The apparatus of claim 60 further comprising:
the actuatable material comprises a piezoelectric material.

65. A line narrowing module for a narrow band DUV high power high repetition rate gas discharge laser producing output laser light pulse beam pulses in bursts of pulses, the module having a nominal optical path, comprising:
a dispersive center wavelength selection optic mounted within an optical path of the line narrowing module, selecting at least one center wavelength for each pulse determined at least in part by the angle of incidence of the laser light pulse beam containing the respective pulse on a dispersive optical face of the dispersive wavelength selection optic;
a single both transmissive and reflective beam expanding prism operative to select an angle of incidence of the laser light pulse beam containing the respective pulse upon the dispersive center wavelength selection optic, by selecting an angle of transmission of the laser light pulse beam containing the pulse toward the dispersive center wavelength selection optic.

66. The apparatus of claim 65
wherein the beam expanding prism has at least one face coated with a totally reflective coating reflecting the beam back into the prism to another face where total internal reflection occurs reflecting the beam to a surface of exit from the prism.

67. The apparatus of claim 65 further comprising:
the fast tuning mechanism is controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

68. The apparatus of claim 66 further comprising:
the fast tuning mechanism is controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

69. The apparatus of claim 67 further comprising:
the fast tuning mechanism comprises an electro-mechanical course positioning mechanism and a fine positioning mechanism comprising an actuatable material that changes position or shape when actuated.

70. The apparatus of claim 68 further comprising:
the fast tuning mechanism comprises an electro-mechanical course positioning mechanism and a fine positioning mechanism comprising an actuatable material that changes position or shape when actuated.

71. The apparatus of claim 69 further comprising:
the actuatable material positioning mechanism comprising an actuatable material that changes position or shape when actuated.

72. The apparatus of claim 70 further comprising:
the actuatable material positioning mechanism comprising an actuatable material that changes position or shape when actuated.

73. The apparatus of claim 71 further comprising:
the actuatable material is selected from a group consisting of electro-actuatable devices, magneto-actuated devices and acousto-actuatable devices.

74. The apparatus of claim 72 further comprising:
the actuatable material is selected from a group consisting of electro-actuatable devices, magneto-actuated devices and acousto-actuatable devices.

75. The apparatus of claim 73 further comprising:
the actuatable material comprises piezoelectric material.

76. The apparatus of claim 74 further comprising:
the actuatable material comprises piezoelectric material.

77. A line narrowing module for a narrow band DUV high power high repetition rate gas discharge laser producing output laser light pulse beam pulses in bursts of pulses, the module having a nominal optical path, comprising:
a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic;
a first tuning mechanism operative in part to select an angle of incidence of at least a first spatially defined portion of the laser light pulse beam containing the respective pulse upon the dispersive center wavelength selection optic, by selecting an angle of transmission of the at least a first spatially defined portion of the laser light pulse beam containing the pulse toward a second tuning mechanism;

the second tuning mechanism being operative in part to select the angle of incidence of the at least a first spatially defined portion of the laser light pulse beam containing the respective pulse by changing an angle of reflection of the at least a first spatially defined portion of the laser light pulse onto the dispersive center wavelength selection optic;

wherein the first tuning mechanism coarsely selects a value for the center wavelength and the second tuning mechanism more finely selects the value for the center wavelength.

78. The apparatus of claim 77 further comprising:
the first and second tuning mechanisms are controlled by a center wavelength controller during a burst based upon feedback from a center wavelength detector detecting the center wavelength of at least one other pulse in the burst of pulses and the controller providing the feedback based upon an algorithm employing the detected center wavelength for the at least one other pulse in the burst.

79. The apparatus of claim 77 further comprising:
the first and second tuning mechanisms each comprise an electro-mechanical course positioning mechanism and a fine positioning mechanism comprising an actuatable material that changes position or shape when actuated.

80. The apparatus of claim 78 further comprising:
the first and second tuning mechanisms each comprise an electro-mechanical course positioning mechanism and a fine positioning mechanism comprising an actuatable material that changes position or shape when actuated.

81. The apparatus of claim 79 further comprising:
the actuatable material is selected from a group consisting of electro-actuatable, magneto-actuatable and acousto-actuatable materials.

82. The apparatus of claim 80 further comprising:
the actuatable material is selected from a group consisting of electro-actuatable, magneto-actuatable and acousto-actuatable materials.

83. The apparatus of claim 81 further comprising:
the actuatable material is a piezoelectric material.

84. The apparatus of claim 82 further comprising:
the actuatable material is a piezoelectric material.

85. The apparatus of claim 77 further comprising:
the first tuning mechanism comprises a beam expanding prism.

86. The apparatus of claim 78 further comprising:
the first tuning mechanism comprises a beam expanding prism.

87. The apparatus of claim 79 further comprising:
the first tuning mechanism comprises a beam expanding prism.

88. The apparatus of claim 80 further comprising:
the first tuning mechanism comprises a beam expanding prism.

89. The apparatus of claim 81 further comprising:
the first tuning mechanism comprises a beam expanding prism.

90. The apparatus of claim 82 further comprising:
the first tuning mechanism comprises a beam expanding prism.

91. The apparatus of claim 83 further comprising:
the first tuning mechanism comprises a beam expanding prism.

92. The apparatus of claim 84 further comprising:
the first tuning mechanism comprises a beam expanding prism.

93. The apparatus of claim 85 further comprising:
the second tuning mechanism comprises a fast tuning mirror.

94. The apparatus of claim 86 further comprising:
the second tuning mechanism comprises a fast tuning mirror.

95. The apparatus of claim 87 further comprising:
the second tuning mechanism comprises a fast tuning mirror.

96. The apparatus of claim 88 further comprising:
the second tuning mechanism comprises a fast tuning mirror.

97. The apparatus of claim 89 further comprising:
the second tuning mechanism comprises a fast tuning mirror.

98. The apparatus of claim 90 further comprising:
the second tuning mechanism comprises a fast tuning mirror.

99. The apparatus of claim 91 further comprising:
the second tuning mechanism comprises a fast tuning mirror.

100. The apparatus of claim 92 further comprising:
the second tuning mechanism comprises a fast tuning mirror.

101. A line narrowing module for a narrow band DUV high power high repetition rate gas discharge laser producing output laser light pulse beam pulses in bursts of pulses, the module having a nominal optical path, comprising:

a dispersive center wavelength selection optic moveably mounted within an optical path of the line narrowing module, selecting at least one center wavelength for each pulse determined at least in part by the angle of incidence of the laser light pulse beam containing the respective pulse on the dispersive wavelength selection optic;

a first tuning mechanism operative in part to select a first angle of incidence of a first spatially defined portion of the laser light pulse beam containing the respective pulse upon the dispersive center wavelength selection optic, and a second tuning mechanism operative to select a second angle of incidence of a second spatially defined portion of the laser light pulse, respectively by selecting a first and a second angle of transmission of the respective spatially defined portions of the laser light pulse beam containing the pulse relative to a nominal optical path through the line narrowing module toward the dispersive center wavelength selection optic;

the tuning mechanism selecting the center wavelength for each of the first and second spatially defined portions of the pulse in the laser light pulse beam to have overlapping spectra, forming a combined spectrum, the degree of overlapping selected to achieve a desired ratio between a first measure of the bandwidth of the combined spectrum and a second measure of the bandwidth of the combined spectrum.

102. The apparatus of claim 101 further comprising:
the first tuning mechanism comprising a variably refractive optical element inserted into the nominal optical path by a selected amount defining the first angle of incidence for the first spatially defined portion of the laser light pulse beam and the second tuning mechanism selecting the second angle of incidence by not modifying the angle of transmission of the second spatially defined portion of the laser light pulse beam pulse.

103. The apparatus of claim 101 further comprising:
the first tuning mechanism comprising a first variably refractive optical element inserted into the nominal optical path by a first selected amount defining the first angle of incidence for the first spatially defined portion of the laser light pulse beam and the second tuning mechanism comprising a second variably refractive optical element inserted into the nominal optical path by a second selected amount defining the second angle of incidence for the second spatially defined portion of the laser light pulse beam.

104. The apparatus of claim 102 further comprising:
the first tuning mechanism comprising an optical element having a surface of incidence or transmission defining a plurality of refractive transmission angles relative to the nominal optical path for a laser light pulse beam incident on the optical element at one of a plurality of selected positions along a longitudinal axis of the optical element parallel to a direction of insertion of the optical element into the nominal optical path.

105. The apparatus of claim 103 further comprising:
the first and second tuning mechanisms each comprising an optical element having a surface of incidence or transmission defining a plurality of refractive transmission angles relative to the nominal optical path for a laser light pulse beam incident on the optical element at one of a plurality of selected positions along a longitudinal axis of the optical element parallel to a direction of insertion of the optical element into the nominal optical path.

106. The apparatus of claim 104 further comprising:
the first tuning mechanism comprising the surface of incidence or transmission comprising a plurality of adjacent wedges each defining a respective refractive angle of transmission of the laser light pulse beam through a respective one of the plurality of adjacent wedges.

107. The apparatus of claim 105 further comprising:
the first and second tuning mechanisms each comprising the surface of incidence or transmission comprising a plurality of adjacent wedges each defining a respective refractive angle of transmission of the laser light pulse beam through a respective one of the plurality of adjacent wedges.

108. The apparatus of claim 104 further comprising:
the first tuning mechanism comprising the surface of incidence or transmission comprising a curved surface defining for a respective point of transmission of the laser light pulse beam through the optical element along the longitudinal axis an effective refractive angle of transmission.

109. The apparatus of claim 105 further comprising:
the first and second tuning mechanisms each comprising the surface of incidence or transmission comprising a curved surface defining for a respective point of transmission of the laser light pulse beam through the optical element along the longitudinal axis an effective refractive angle of transmission.

110. The apparatus of claim 106 further comprising:
the curved surface is a cylindrical surface.

111. The apparatus of claim 107 further comprising:
the curved surface is a cylindrical surface.

112. A method of line narrowing for a narrow band DUV high power high repetition rate gas discharge laser producing output laser light pulse beam pulses in bursts of pulses, the module having a nominal optical path, comprising:
with a dispersive center wavelength selection optic moveably mounted within an optical path of a line narrowing module, selecting at least one center wavelength for each pulse determined at least in part by the angle of incidence of the laser light pulse beam containing the respective pulse on the dispersive wavelength selection optic;
with a first tuning mechanism selecting the angle of incidence of the laser light pulse beam containing the respective pulse upon the dispersive center wavelength selection optic, by selecting an angle of transmission of the laser light pulse beam containing the pulse toward the dispersive center wavelength selection optic;
with a second tuning mechanism in part selecting the angle of incidence of the laser light pulse beam containing the respective pulse by changing the position of the dispersive center wavelength selection optic relative to the nominal optical path of the line narrowing module;
using the second tuning mechanism to coarsely select a value for the center wavelength and the first tuning mechanism to more finely select the value for the center wavelength.

* * * * *